(12) United States Patent
Higuchi et al.

(10) Patent No.: US 10,840,083 B2
(45) Date of Patent: Nov. 17, 2020

(54) SUBSTRATE CLEANING METHOD, METHOD FOR CREATING SUBSTRATE CLEANING RECIPE, AND DEVICE FOR CREATING SUBSTRATE CLEANING RECIPE

(71) Applicant: SCREEN Holdings Co., Ltd., Kyoto (JP)

(72) Inventors: Ayumi Higuchi, Kyoto (JP); Kana Komori, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/324,134

(22) PCT Filed: Sep. 4, 2017

(86) PCT No.: PCT/JP2017/031796
§ 371 (c)(1),
(2) Date: Feb. 8, 2019

(87) PCT Pub. No.: WO2018/056038
PCT Pub. Date: Mar. 29, 2018

(65) Prior Publication Data
US 2019/0176196 A1 Jun. 13, 2019

(30) Foreign Application Priority Data
Sep. 26, 2016 (JP) ................................. 2016-187098

(51) Int. Cl.
*H01L 21/02* (2006.01)
*B08B 7/04* (2006.01)
(Continued)

(52) U.S. Cl.
CPC .......... *H01L 21/02057* (2013.01); *B08B 3/08* (2013.01); *B08B 3/12* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2003/0178047 A1 | 9/2003 | Hirae | 134/26 |
| 2006/0144421 A1 | 7/2006 | Matsuo et al. | 134/2 |

(Continued)

FOREIGN PATENT DOCUMENTS

| | | |
|---|---|---|
| JP | H07-022365 A | 1/1995 |
| JP | 2000-315670 A | 11/2000 |

(Continued)

OTHER PUBLICATIONS

Translation of JP2006-278387.*

(Continued)

*Primary Examiner* — Erin F Bergner
(74) *Attorney, Agent, or Firm* — Ostrolenk Faber LLP

(57) ABSTRACT

Provided is a substrate cleaning method for cleaning a substrate having an oxide film on the surface thereof. The method includes a partial etching step of etching the oxide film to a predetermined film thickness, and a physical cleaning step of executing physical cleaning on the surface of the substrate after the partial etching step. The oxide film may be a natural oxide film with particles at least partially taken into the film. In this case, the partial etching step may either expose the particles from the natural oxide film or increase the exposed portion from the natural oxide film. The physical cleaning may remove, by physical action, the particles exposed from the natural oxide film while leaving the natural oxide film on the surface of the substrate.

2 Claims, 14 Drawing Sheets

(51) Int. Cl.
  *H01L 21/311* (2006.01)
  *B08B 7/00* (2006.01)
  *B08B 3/12* (2006.01)
  *B08B 7/02* (2006.01)
  *B08B 3/08* (2006.01)

(52) U.S. Cl.
  CPC ............ *B08B 7/0021* (2013.01); *B08B 7/028* (2013.01); *B08B 7/04* (2013.01); *H01L 21/02052* (2013.01); *H01L 21/31111* (2013.01)

(56) References Cited

U.S. PATENT DOCUMENTS

| | | | |
|---|---|---|---|
| 2006/0151112 A1 | 7/2006 | Yoshida et al. | 156/345.15 |
| 2007/0232067 A1 | 10/2007 | Hirota et al. | 438/689 |
| 2010/0093177 A1* | 4/2010 | Kozasa | H01L 21/02046 438/704 |
| 2012/0186607 A1 | 7/2012 | Higashijima et al. | 134/30 |
| 2014/0261577 A1 | 9/2014 | Furukawa et al. | 134/113 |

FOREIGN PATENT DOCUMENTS

| | | |
|---|---|---|
| JP | 2003-275696 A | 9/2003 |
| JP | 2006-203161 A | 8/2006 |
| JP | 2006-278387 A | 10/2006 |
| JP | 2012-156267 A | 8/2012 |
| JP | 2013-030612 A | 2/2013 |
| JP | 2013-214757 A | 10/2013 |
| JP | 2014-067936 A | 4/2014 |
| JP | 2014-179449 A | 9/2014 |
| JP | 2015-065355 A | 4/2015 |
| KR | 10-2005-0100605 A | 10/2005 |
| KR | 10-2007-0098651 A | 10/2007 |

OTHER PUBLICATIONS

International Preliminary Report on Patentability (Chapter I) dated Apr. 4, 2019 with a Notification from the International Bureau (Form PCT/IB/326) in corresponding PCT International Application No. PCT/JP2017/031796 in Japanese.
English translation of the International Preliminary Report on Patentability (Chapter I) dated Apr. 4, 2019 with a Notification from the International Bureau (Form PCT/IB/338) in corresponding PCT International Application No. PCT/JP2017/031796.
International Search Report dated Oct. 10, 2017 in corresponding PCT International Application No. PCT/JP2017/031796.
Written Opinion dated Oct. 10, 2017 in corresponding PCT International Application No. PCT/JP2017/031796.

* cited by examiner

FIG. 8

| Step number | 1 | 2 | 3 | 4 | 5 | 6 | 7 |
|---|---|---|---|---|---|---|---|
| Jump destination | — | — | — | — | — | — | — |
| Substrate rotational speed(rpm) | 1000 | 1000 | 1000 | 1000 | 1000 | 2500 | 0 |
| Process time (sec) | 1 | 60 | 15 | 60 | 15 | 15 | 1 |
| First valve | | V1 | V3 | V2 | V3 | | |
| First flow rate(ml) | | 500 | 1500 | 100 | 1500 | | |
| Second valve | | | | V21 | | | |
| Second flow rate(ml) | | | | 20000 | | | |
| Third valve | | | | V3 | | | |
| Third flow rate(ml) | | | | 200 | | | |
| Fourth valve | | | | | | | |
| Fourth flow rate(ml) | | | | | | | |
| Nozzle control 1 | — | First movable nozzle center | — | Second movable nozzle scan | — | — | — |
| Nozzle control 2 | — | — | — | | — | — | — |

…

SUBSTRATE CLEANING METHOD, METHOD FOR CREATING SUBSTRATE CLEANING RECIPE, AND DEVICE FOR CREATING SUBSTRATE CLEANING RECIPE

CROSS-REFERENCE TO RELATED APPLICATIONS

The present application is a 35 U.S.C. §§ 371 national phase conversion of PCT/JP2017/031796, filed Sep. 4, 2017, which claims priority to Japanese Patent Application No. 2016-187098, filed Sep. 26, 2016, the contents of both of which are incorporated herein by reference. The PCT International Application was published in the Japanese language.

TECHNICAL FIELD

The present invention relates to a method for cleaning a substrate, and a method and device for creating a substrate cleaning recipe. The present invention further relates to a computer program to allow a computer to function as a device for creating a substrate cleaning recipe. Substrates to be cleaned include, for example, semiconductor wafers, substrates for liquid crystal display devices, substrates for plasma displays, substrates for FEDs (field emission displays), substrates for optical disks, substrates for magnetic disks, substrates for magneto-optical discs, substrates for photomasks, ceramic substrates, and substrates for solar batteries.

BACKGROUND ART

For cleaning substrates such as semiconductor wafers, a so-called physical cleaning may be employed. The physical cleaning is defined as a processing to remove foreign matter (hereafter to be referred to as "particles") on a surface of a substrate by physical action, more specifically, by mechanical energy. Specific examples of physical cleaning include ultrasonic cleaning, two-fluid cleaning, ink jet cleaning, solidified dissolution cleaning, which are described, for example, in Patent Literatures 1 to 3, respectively.

For example, the two-fluid cleaning employs a two-fluid nozzle to supply a mixed fluid of a gas and a liquid being mixed together onto the surface of a substrate. Droplets in the mixed fluid collide with the surface of the substrate, and the impact causes particles on the surface of the substrate to be separated and thereby removed from the substrate. The greater the kinetic energy of the mixed fluid, the greater the removal performance becomes. On the other hand, there may be a possibility that excessive kinetic energy would cause the pattern for device formation on the substrate surface to be damaged (e.g., pattern collapse). That is, there is a trade-off relationship between the particle removal and the pattern damage. Thus, it is preferable to employ a mixed fluid having as great a kinetic energy as possible within a range in which pattern damage does not occur.

The same circumstances hold true in the other physical cleaning techniques. That is, in order to impart, to the particles on the substrate, the greatest physical force (energy) as possible without causing no damage to the pattern, settings are made to parameters to control the physical force in each of the cleaning processings.

CITATION LIST

Patent Literature

Patent Literature 1: Japanese Patent Application Publication No. 2013-214757
Patent Literature 2: Japanese Patent Application Publication No. 2003-275696
Patent Literature 3: Japanese Patent Application Publication No. 2014-179449

SUMMARY OF INVENTION

Technical Problem

With finer patterns formed on the surface of a substrate, less physical force causes damage to the patterns. Accordingly, this leads to a smaller range of physical force or physical energy, that is, a smaller process window that enables removal of particles on the substrate and avoidance of damage to the patterns on the substrate. It is thus more difficult for the physical cleaning to achieve an outstanding particle removal performance while damage to the pattern is avoided.

Thus, one object of the present invention is to provide a substrate cleaning method which enables efficient removal of particles on the substrate by applying the physical cleaning and suppress damage to the patterns on the substrate.

Another purpose of the present invention is to provide a method and device for creating a substrate cleaning recipe to execute the substrate cleaning method mentioned above.

Still another purpose of the present invention is to provide a computer program for allowing a computer to function as a device for creating a substrate cleaning recipe.

Solution to Problem

The present invention provides a substrate cleaning method for cleaning a substrate having an oxide film on a surface thereof. The substrate cleaning method includes a partial etching step of etching the oxide film to a predetermined film thickness, and a physical cleaning step of executing physical cleaning on the surface of the substrate after the partial etching step.

According to this method, the oxide film of the surface of the substrate is partially etched to a predetermined film thickness. That is, the surface portion of the oxide film is etched, thereby leaving the oxide film of the predetermined film thickness. Etching the surface portion of the oxide film causes particles taken partially or entirely in the oxide film to be exposed and the ratio of that exposed portion to be increased. Thus, executing the physical cleaning after that makes it possible to remove particles with relatively less energy. In this manner, since the required particle removal performance can be achieved by the physical cleaning with less energy, damage to the patterns formed on the substrate surface can be suppressed or avoided.

Since the surface portion of the oxide film is selectively etched, there are no adverse effects to the underlayer beneath the oxide film. It is thus possible to remove particles on the substrate without adversely affecting the underlayer.

In a preferred embodiment of the present invention, the oxide film is a natural oxide film that has at least partially taken particles. Further, the partial etching step is to allow the particles to be exposed from the natural oxide film or the exposed portion from the natural oxide film to be increased. Furthermore, the physical cleaning is a step of removing the particles exposed from the natural oxide film by a physical action while leaving the natural oxide film on the surface of the substrate.

When the natural oxide film is formed on the substrate surface after particles are adhered to the substrate surface, the particles are partially or entirely taken into the natural oxide film. Furthermore, there is a possibility that particles may be adhered onto the substrate surface of the natural oxide film being formed (precisely speaking, the surface of the natural oxide film being in formation). Even in such a case, particles are partially or entirely taken into the natural oxide film.

In this context, since the ratio of the exposed portion of particles can be increased by partially etching the natural oxide film (in particular, by etching the surface portion), it is thus possible for the subsequent physical cleaning to remove particles with relatively less energy. As a result, it is thus possible to remove particles on the substrate while suppressing or avoiding damage to the pattern.

In a preferred embodiment of the present invention, the partial etching step includes a step of supplying a diluted hydrofluoric acid onto the surface of the substrate. In this method, the diluted hydrofluoric acid is used to perform the partial etching of the oxide film (e.g., a natural oxide film). Removing the entire oxide film using the diluted hydrofluoric acid is not preferable because there is a possibility of roughness occurring on the surface of the substrate. In this context, it is possible to partially etch the oxide film to some midpoint in the film thickness, thereby removing particles on the substrate, with the surface of the substrate maintained in a good condition, while damage to the pattern is suppressed or avoided.

In a preferred embodiment of the present invention, the diluted hydrofluoric acid is a hydrofluoric acid (hydrogen fluoride acid) having a concentration (mass concentration) of 0.1% to 0.5%. This enables partial etching (light etching) on an oxide film (in particular, natural oxide film) with a high accuracy. It is thus possible to remove particles on the substrate, with the surface of the substrate maintained in a good condition, while damage to the pattern is suppressed or avoided.

In a preferred embodiment of the present invention, the physical cleaning step includes at least one of: a two-fluid cleaning step of supplying a mixed fluid, which is a mixture of a gas and a liquid, to the surface of the oxide film; an ultrasonic cleaning step of supplying a liquid, to which ultrasonic is imparted, to the surface of the oxide film; an inkjet type droplets cleaning step of supplying droplets from an ink jet head to the surface of the oxide film; and a solidification cleaning step of forming a liquid film on the surface of the oxide film and then solidifying the resulting liquid film to form a solidified film, and melting and removing the solidified film.

As described above, the physical cleaning may be any one of the two-fluid cleaning, the ultrasonic cleaning, the ink jet cleaning, or the solidification cleaning, or a combination of two or more of the cleaning methods. In any case, since the physical energy can be reduced, it is possible to remove particles while damage to the pattern is suppressed or avoided.

The present invention further provides a substrate cleaning recipe creating method for creating recipe data to be registered with a substrate processing apparatus in order to execute, in the substrate processing apparatus, substrate cleaning processing to clean a substrate having an oxide film on a surface thereof. The substrate cleaning processing includes the partial etching step of etching the oxide film to a predetermined film thickness, and the physical cleaning step of executing the physical cleaning on the surface of the substrate after the partial etching step. The method for creating a substrate cleaning recipe includes: a partial etching step creating step of creating step data for executing the partial etching step; a physical cleaning step creating step of creating step data for executing the physical cleaning step; and a condition matching step of matching an etching condition in the partial etching step and a physical cleaning condition in the physical cleaning step on the basis of criteria data prepared in advance.

This method creates recipe data for executing the aforementioned substrate cleaning method. The recipe data is registered with the substrate processing apparatus. The substrate processing apparatus operates in accordance with the recipe data, thereby executing the aforementioned substrate cleaning method. The etching condition of the partial etching step and the physical cleaning condition of the physical cleaning step are matched on the basis of the criteria data. Since this enables creating recipe data with the etching condition and the physical cleaning condition being matched, it is thus possible to create the recipe data that makes it possible to achieve an appropriate substrate cleaning processing as a whole, that is, a substrate cleaning processing that achieves a required particle removal performance while damage to the pattern is suppressed or avoided.

The criteria data is prepared in advance. Specifically, found on the basis of various combinations between an etching condition and a physical cleaning condition is the matched relationship between the conditions, on the basis of which the criteria data may be created. More specifically, while the physical cleaning energy is set within the range in which no damage to the pattern occurs or damage to the pattern is allowable, various etching conditions are set to attempt the substrate cleaning (partial etching step and the physical cleaning step) a plurality of times. For each attempt, the particle removal ratio is determined. Within the range in which the particle removal ratio is acceptable, the etching conditions that match the physical cleaning energy are specified. While the physical cleaning energy is varied in a variety of ways within the range in which no damage to the pattern occurs or damage to the pattern is allowable, an etching condition that matches each energy can be determined. It would be then possible to acquire the criteria data indicating the matched relationship between the etching condition and the physical cleaning energy.

In the method for creating a substrate cleaning recipe according to a preferred embodiment of the present invention, the partial etching step creating step includes a step of creating step data that includes an etching condition in the partial etching step. Furthermore, the condition matching step includes a step of presenting or setting, on the basis of the criteria data, the physical cleaning condition that matches the etching condition included in the step data created in the partial etching step creating step.

In this method, the etching condition is set in the partial etching step creating step, and the physical cleaning condition that matches the etching condition is presented or set. This facilitates creating the physical cleaning step data including the physical cleaning condition that matches the etching condition.

In a method for creating a substrate cleaning recipe according to a preferred embodiment of the present invention, the physical cleaning step creating step includes a step of creating step data including the physical cleaning condition of the physical cleaning step. Further, the condition matching step includes a step of presenting or setting, on the basis of the criteria data, the etching condition that matches the physical cleaning condition included in the step data created in the physical cleaning step creating step.

In this method, in the physical cleaning step creating step, the physical cleaning condition is set, and the etching condition that matches the physical cleaning condition is presented or set. This facilitates creating the partial etching step data including the etching condition that matches the physical cleaning condition.

The present invention further provides a device for creating a substrate cleaning recipe which creates recipe data to be registered with a substrate processing apparatus in order to execute a substrate cleaning processing to clean a substrate having an oxide film on a surface thereof in the substrate processing apparatus. The substrate cleaning processing includes a partial etching step of etching the oxide film to a predetermined film thickness, and a physical cleaning step of executing the physical cleaning on the surface of the substrate after the partial etching step. Further, the device for creating a substrate cleaning recipe includes: command input means which receives a command input by a user; partial etching step creating means which creates step data for executing the partial etching step in response to the command input from the command input means; physical cleaning step creating means which creates step data for executing the physical cleaning step in response to a command input from the command input means; and condition matching means which matches etching conditions in the partial etching step and a physical cleaning condition in the physical cleaning step on the basis of criteria data prepared in advance.

This device enables creating recipe data for executing the aforementioned substrate cleaning method. The created recipe data is registered with the substrate processing apparatus. The substrate processing apparatus is operated in accordance with the recipe data, thereby allowing the aforementioned substrate cleaning method to be executed. The etching condition of the partial etching step and the physical cleaning condition of the physical cleaning step are matched on the basis of the criteria data. Since this enables creating the recipe data with the etching condition and the physical cleaning condition being matched, it is possible to create the recipe data that makes it possible to achieve an appropriate substrate cleaning processing as a whole, that is, a substrate cleaning processing that achieves a required particle removal performance while damage to the pattern is suppressed or avoided.

In the device for creating a substrate cleaning recipe according to a preferred embodiment of the present invention, the partial etching step creating means includes means of creating step data used to set the etching condition in the partial etching step in response to a command input from the command input means. Furthermore, the condition matching means includes means of presenting or setting, on the basis of the criteria data, the physical cleaning condition that matches the etching condition included in the step data created by the partial etching step creating means.

This configuration enables creating step data used to set the etching condition by the partial etching step creating means. Further, the physical cleaning condition that matches the etching condition is presented or set. This facilitates creating the physical cleaning step data including the physical cleaning condition that matches the etching condition.

In the device for creating substrate cleaning recipe according to a preferred embodiment of the present invention, the physical cleaning step creating means includes means of creating step data used to set the physical cleaning condition in the physical cleaning step in response to a command input from the command input means. Furthermore, the condition matching means includes means of presenting or setting, on the basis of the criteria data, the etching condition that matches the physical cleaning condition included in the step data created by the physical cleaning step creating means.

This configuration allows for creating step data used to set the physical cleaning condition by the physical cleaning step creating means. Further, the etching condition that matches the physical cleaning condition is presented or set. This facilitates creating the partial etching step data including the etching condition that matches the physical cleaning condition.

The substrate recipe creation device having the aforementioned features may be incorporated into a substrate processing apparatus or may be provided separately from the substrate processing apparatus.

The present invention further provides a computer program or a computer program product into which a group of execution steps is incorporated (that is, which is programmed) to allow a computer to function as the device for creating a substrate cleaning recipe. This makes it possible to achieve the aforementioned device for creating a substrate cleaning recipe by the computer.

The computer program may be recorded and provided on a computer-readable recording medium. Such a recording medium may be included in the computer, or may be a recording medium separate from the computer. Furthermore, the computer program may be provided by communication via a communication line. The communication line may be partially or entirely a wireless line.

The above and yet other objects, features, and effects of the present invention shall be made clear by the following description of the preferred embodiments in reference to the attached drawings.

BRIEF DESCRIPTION OF DRAWINGS

FIG. 8 is a view showing recipe data as an example for executing the aforementioned substrate cleaning processing.

DESCRIPTION OF EMBODIMENTS

Figure 1A:
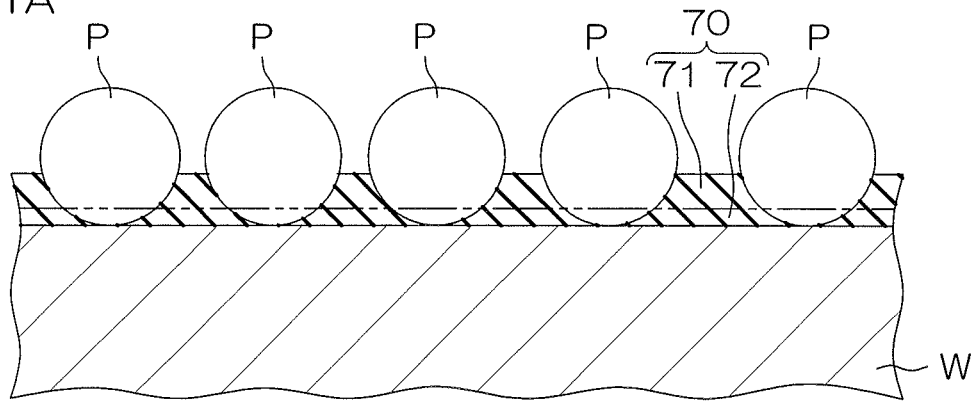
FIG. 1A, FIG. 1B, and FIG. 1C are explanatory cross-sectional views illustrating a substrate cleaning method according to a preferred embodiment of the present invention.
Figure 1B:
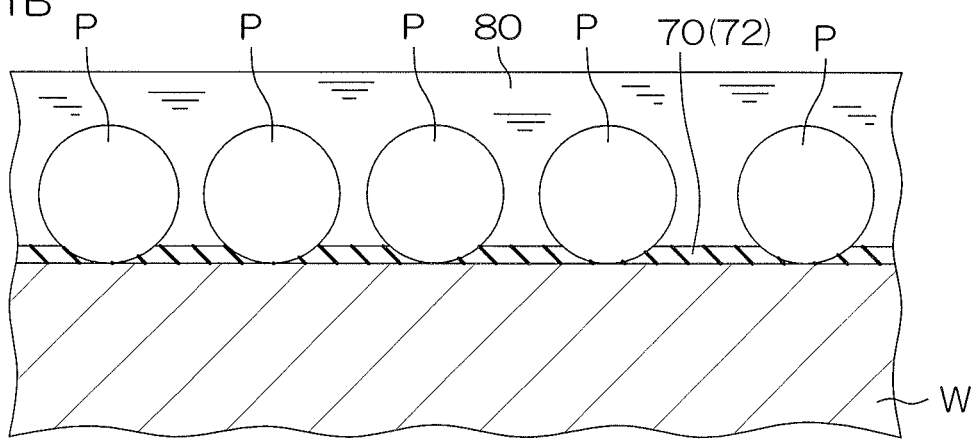
Figure 1C:
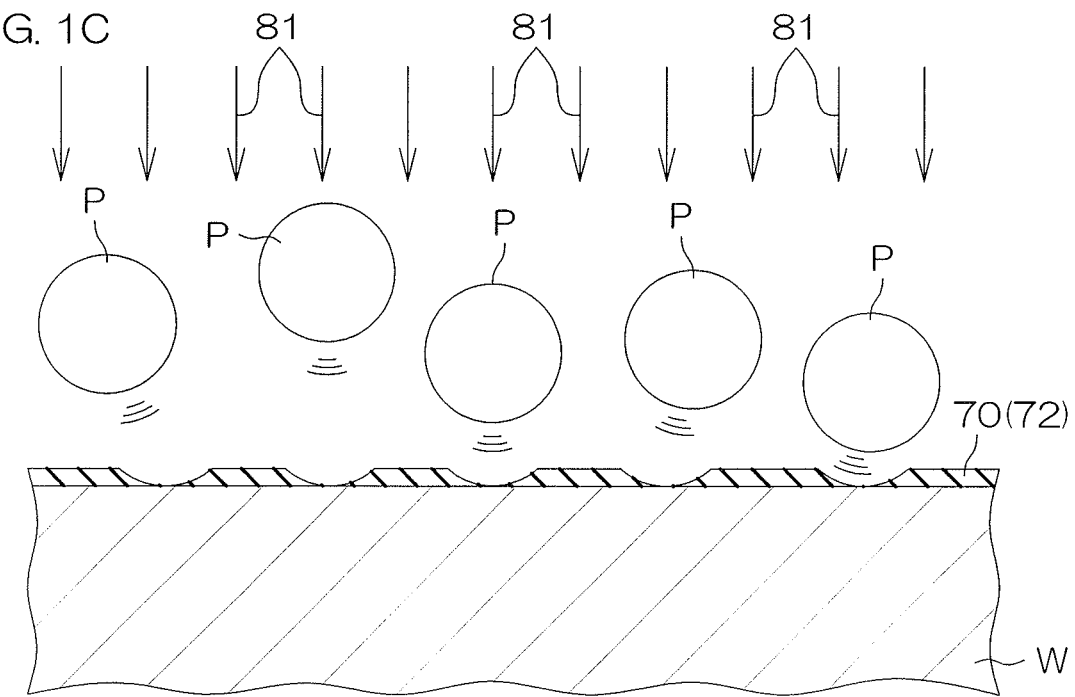

FIG. 1A, FIG. 1B, and FIG. 1C are explanatory cross-sectional views illustrating a substrate cleaning method according to a preferred embodiment of the present invention. FIG. 1A is an enlarged view illustrating the state of the surface of a substrate W before cleaning processing. The substrate W to be cleaned is, for example, a semiconductor wafer. The surface of the substrate W has fine patterns (not illustrated) that constitute the device. Further, there are particles P adhered to the surface of the substrate W. The particles P are partially taken into a natural oxide film 70 (e.g., $SiO_2$) formed on the surface of the substrate W. Thus, the natural oxide film 70 reinforces the particles P being adhered to the substrate W.

The substrate cleaning method of this preferred embodiment includes the partial etching step illustrated in FIG. 1B, and the physical cleaning step illustrated in FIG. 1C. The physical cleaning step is executed after the partial etching step.

In this preferred embodiment, in the partial etching step (FIG. 1B), the surface of the substrate W is supplied with a diluted hydrofluoric acid 80. This causes the natural oxide film 70 to be partially etched to a predetermined film thickness. That is, the natural oxide film 70 is not entirely removed, but etched (lightly etched) to some midpoint in the film thickness of a surface portion 71 (see FIG. 1C), so that a portion 72 of a predetermined film thickness is left on the surface of the substrate W. This partial etching step causes an increase in the exposed portion of the particles P. If particles P are entirely taken into the natural oxide film 70 at the stage before the partial etching step, the particles P are partially exposed from the natural oxide film 70, with the exposed portion thereafter increased, in the partial etching step. Note that FIG. 1B illustrates only those particles P that are partially taken into the natural oxide film 70.

The concentration (mass concentration) of the diluted hydrofluoric acid 80 is constant, for example, within 0.1% to 0.5%. The amount of etching with the diluted hydrofluoric acid 80 of this constant concentration depends on the supply flow rate of the diluted hydrofluoric acid 80 serving as an etching liquid and the supply time (etching time). For example, when the diluted hydrofluoric acid 80 is supplied at a constant flow rate, the amount of etching depends on the etching time. Thus, the etching conditions in the partial etching step include the supply flow rate of the diluted hydrofluoric acid 80 and the etching time. If the supply flow rate of the diluted hydrofluoric acid 80 is constant, the variation parameter of the etching condition is the etching time (supply time of the diluted hydrofluoric acid).

The physical cleaning step (see FIG. 1C) in this preferred embodiment is the two-fluid cleaning step. More specifically, the two-fluid nozzle (not illustrated in FIG. 1C) mixes a liquid and a gas to generate a mixed fluid 81, and then the mixed fluid 81 is supplied to the surface of the substrate W. Still more specifically, supplied to the two-fluid nozzle are DIW (deionized water) as an example of a liquid and an inert gas (e.g., a nitrogen gas) as an example of a gas. These are mixed together through the two-fluid nozzle to form the mixed fluid 81, and the mixed fluid 81 is supplied to the surface of the substrate W. The mixed fluid 81 includes fine droplets of DIW, and the fine droplets are conveyed by the flow of the inert gas to collide with the surface of the substrate W. The impact by the collision causes the particles P on the surface of the substrate W to be peeled off from the substrate W.

The energy carried by the mixed fluid 81 can be controlled mainly by the supply flow rate and the supply time of the inert gas to the two-fluid nozzle. That is, DIW is supplied at a constant flow rate to the two-fluid nozzle, while the flow rate of the inert gas and the supply time of the mixed fluid are controlled depending on the desired energy. This causes variations in the droplet size and the density of the droplets in the mixed fluid 81 and the kinetic energy carried by the droplets. Thus, this makes it possible to control the physical force, that is, the physical energy carried by the mixed fluid 81. Accordingly, the physical cleaning conditions in the two-fluid cleaning step as the physical cleaning step include the supply flow rate of the inert gas and the supply time of the mixed fluid as variation parameters.

The natural oxide film 70 is partially removed in the partial etching step, thereby causing the particles P to be exposed or the exposed portion of the particles P to be increased. Thus, in the subsequent two-fluid cleaning step, it is possible to sufficiently remove the particles P even with small physical energy. That is, since the two-fluid cleaning step with small physical energy can be employed, it is possible to suppress or avoid damage to the pattern formed to form devices formed on the surface of the substrate W.

Figure 2A:
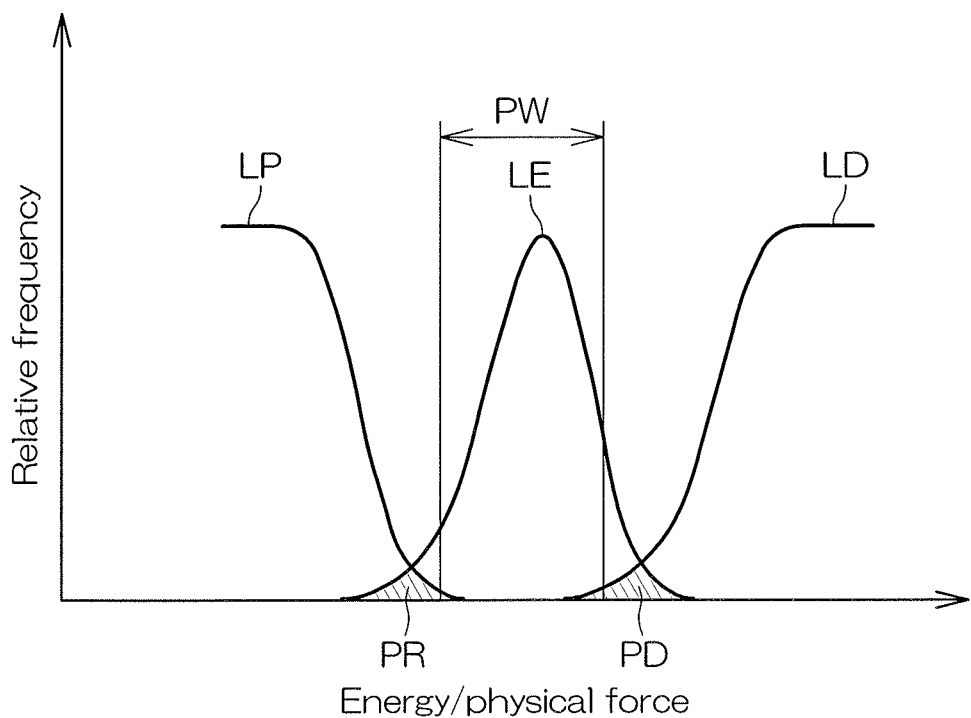
FIG. 2A and FIG. 2B are explanatory views illustrating a process window in the physical cleaning such as the two-fluid cleaning.
Figure 2B:
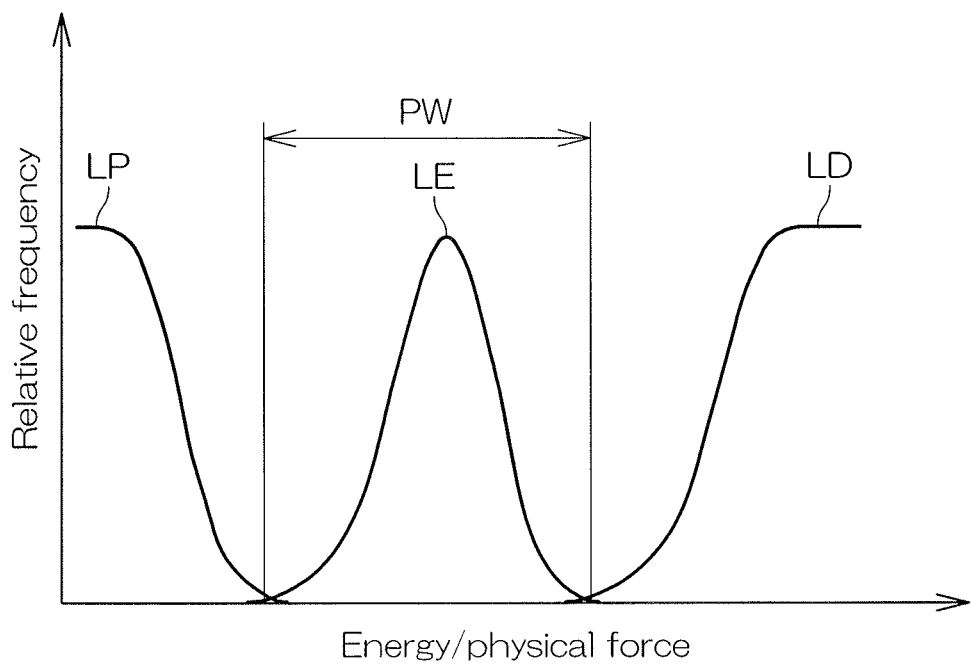

FIG. 2A and FIG. 2B are explanatory views illustrating a process window in the physical cleaning such as the two-fluid cleaning. The horizontal axis denotes the energy (mechanical energy) or the physical force of the physical cleaning, while the vertical axis denotes the relative frequency. The curve LP denotes the number of particles left on the substrate after the physical cleaning. It can be seen that the greater the energy of the physical cleaning, the fewer the number of residual particles becomes. In order to remove substantially all particles from the substrate by the physical cleaning, the lower limit of the physical cleaning energy is set in the vicinity of the boundary on which the curve LP is in contact with the horizontal axis. The curve LD denotes the number of pattern damage to the pattern observed on the substrate after the physical cleaning. Pattern damage will not occur if physical cleaning energy is small. With increasing physical cleaning energy, the number of pattern damage is increased. In order to suppress or avoid damage to the pattern by the physical cleaning, the upper limit of the physical cleaning energy is set in the vicinity of the boundary on which the curve LD is in contact with the horizontal axis. The separation between the lower limit and the upper limit of the physical cleaning energy is called the process window PW. Setting the physical cleaning energy within the process window PW makes it possible to efficiently remove particles on the substrate while suppressing or avoiding damage to the pattern. There is a range in the physical cleaning energy, for example, as shown by a curve LE.

When a pattern formed on the substrate is fine, small physical cleaning energy may cause damage to the pattern. Then, the separation between the curves LP, LD becomes narrow, that is, the process window PW becomes narrow. As a result, as illustrated in FIG. 2A, there is a possibility that the distribution of the physical cleaning energy denoted by the curve LE overlaps with at least one of the curves LP, LD. The overlapped portion PR of the curves LP, LE (illustrated with a diagonally shaded area) may cause residual particles, while the overlapped portion PD of the curves LE, LD (illustrated with a diagonally shaded area) may cause damage to the pattern. Thus, for a small process window PW, it is difficult to set appropriate physical cleaning energy.

Thus, in this preferred embodiment, before the physical cleaning step is executed, the partial etching step is executed. This decreases the energy required for removing particles by the physical cleaning. That is, as illustrated in FIG. 2B, the curve LP is shifted toward smaller physical cleaning energy or smaller physical force, in other words, to the left side of FIG. 2B. As a result, since the process window PW is widened, the conditions of the physical cleaning can be set so that the distribution of the physical cleaning energy (curve LE) does not overlap with the curves LP, LD. It is thus made possible to set appropriate physical cleaning conditions.

Figure 3:
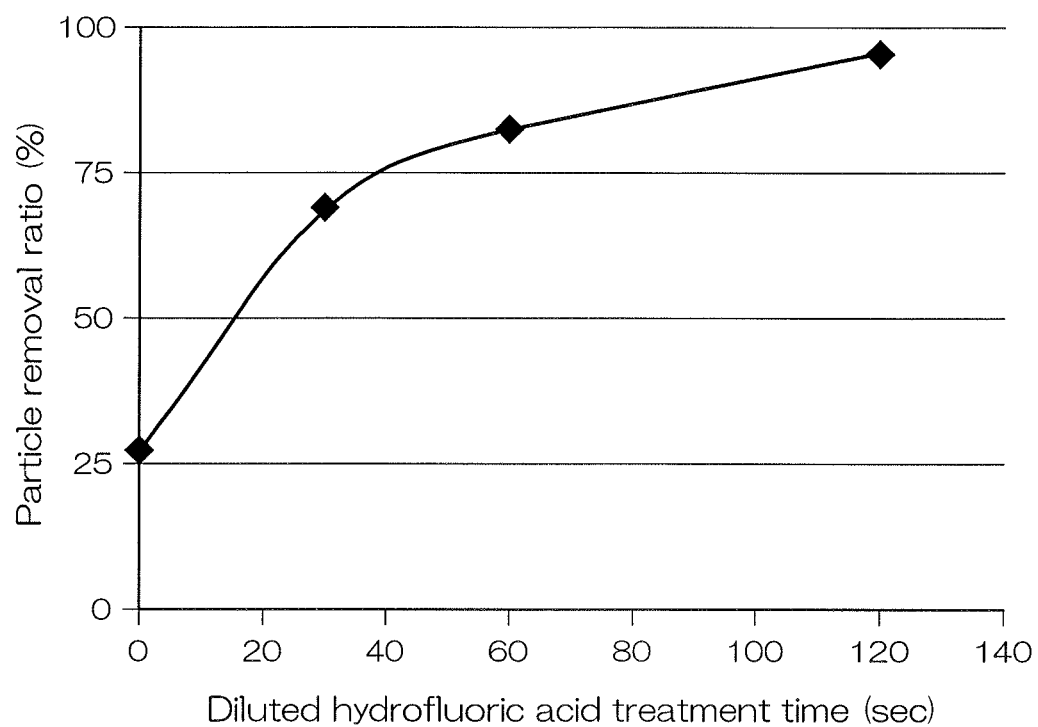
FIG. 3 is a view illustrating results of an experiment for examining the relationship between the time of etching by a diluted hydrofluoric acid in a partial etching step of the substrate cleaning method and the particle removal ratio.

FIG. 3 shows the results of an experiment that examined the relationship between the etching time with a diluted hydrofluoric acid and the particle removal ratio in the partial etching step. More specifically, in the substrate cleaning method, physical cleaning energy capable of suppressing or avoiding damage to the pattern formed on the substrate is set. That is, the physical cleaning conditions were set constant in the physical cleaning step. On the other hand, in the partial etching step, the diluted hydrofluoric acid of a constant concentration was supplied at a constant flow rate, and different etching times (diluted hydrofluoric acid treatment times) were set to a plurality of samples. Further, before the substrate cleaning (before the partial etching step) and after the substrate cleaning (after the physical cleaning step), the number of particles on the substrate was detected in each case, and then the particle removal ratio was determined.

Here, the particle removal ratio refers to the ratio of fine particles removed from the substrate to which fine particles are adhered to the substrate in advance. Specifically, the number of particles $N_0$ on the substrate surface is counted; after that, particles (e.g., $Si_3N_4$ particles) are made to adhered to the surface of the substrate to count the number of particles $N_1$ on the substrate surface; and furthermore, after cleaning, the number of particles $N_2$ on the substrate surface was counted. In this case, the particle removal ratio is computed by the equation below.

Particle removal ratio (%)=100×$(N_1-N_2)/(N_1-N_0)$

From FIG. 3, it can be seen that the particle removal ratio is approximately 27% when the partial etching step is not executed, while the particle removal ratio is increased as the processing time (etching time) with the diluted hydrofluoric acid increases. That is, the particle removal ratio is improved by executing the partial etching step. Furthermore, it can be seen that, for an etching time of 120 seconds or greater, a particle removal ratio close to 100% can be achieved.

Thus, in this example, if the partial etching step is executed with the etching time set to about 120 seconds and after that, the physical cleaning step is executed in the aforementioned physical cleaning conditions, it is then possible to remove particles on the substrate at a removal ratio of approximately 100% while suppressing or avoiding damage to the pattern.

Figure 4A:
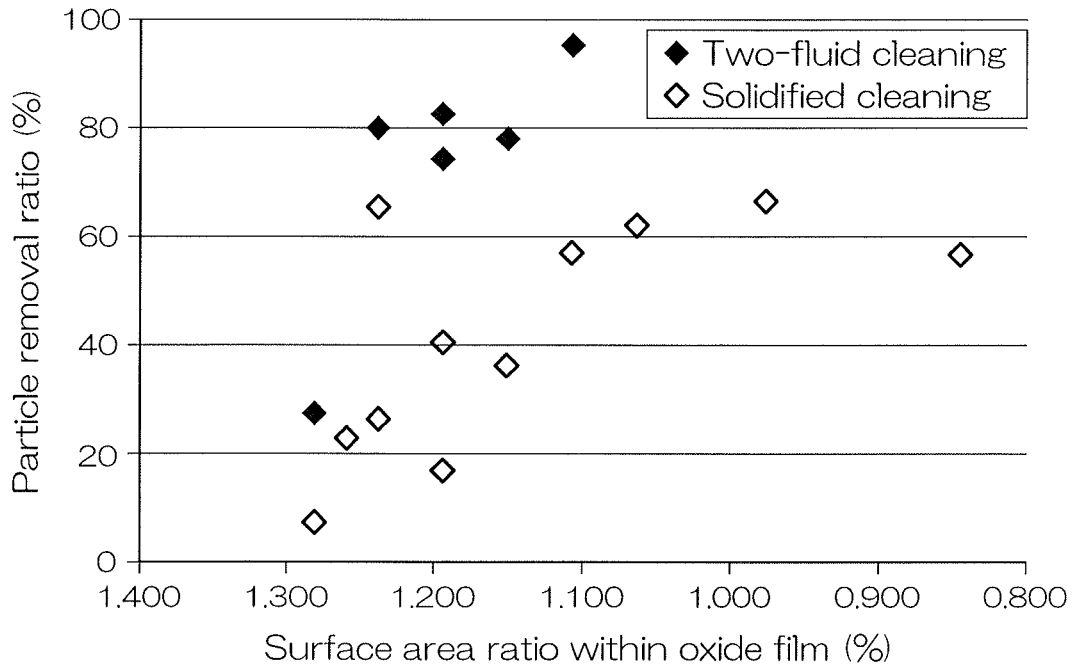
FIG. 4A and FIG. 4B are views illustrating results of a further detailed experiment on the relationship between etching conditions of the partial etching step and the particle removal ratio.
Figure 4B:
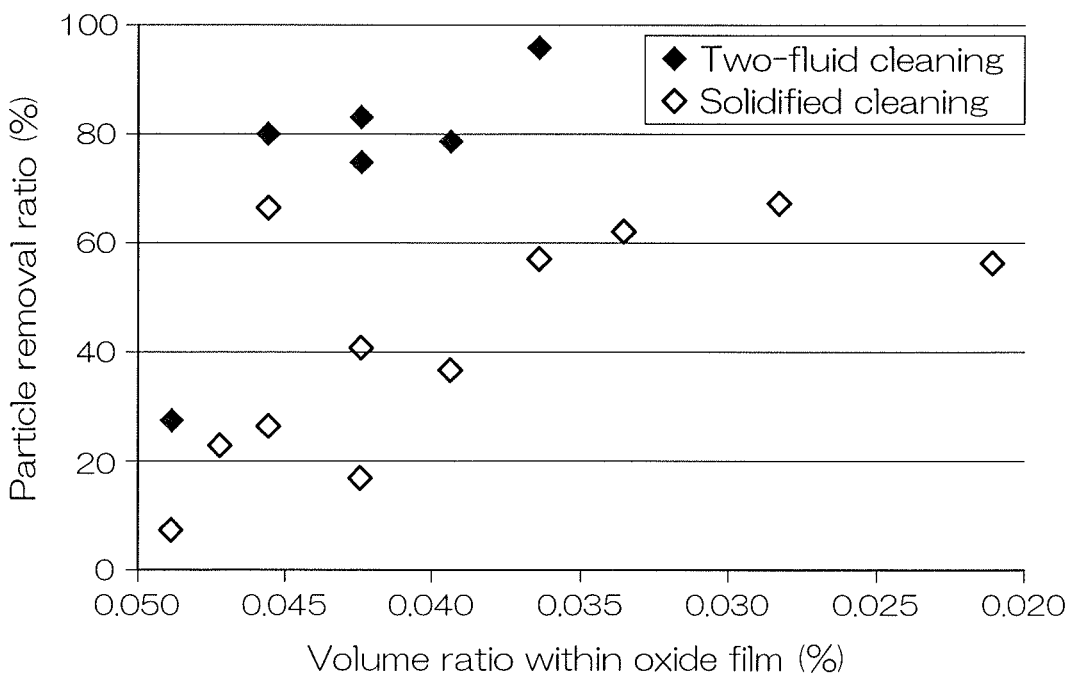

FIG. 4A and FIG. 4B illustrate further detailed experimental results on the relationship between the etching conditions of the partial etching step and the particle removal ratio. In FIG. 4A and FIG. 4B, symbol "♦" denotes an experimental result in the case where the two-fluid cleaning processing was applied in the physical cleaning step. On the other hand, symbol "◇" denotes an experimental result in the case where the solidification cleaning method (See FIG. 13 to be discussed later, in the example of which polymer film was employed) is applied in the physical cleaning step.

In FIG. 4A, the vertical axis denotes the particle removal ratio. The horizontal axis denotes the surface area ratio of the particles in the portion taken into the natural oxide film (surface area ratio within the oxide film). That is, it is the ratio of the partial surface area of the portion in contact with the natural oxide film to the entire surface area of the particles. This surface area ratio corresponds to the etching conditions of the partial etching step in which the diluted hydrofluoric acid is employed. That is, depending on the etching conditions (concentration and the supply time of the diluted hydrofluoric acid), the film thickness to be etched in the partial etching step is determined. On the other hand, the film thickness of the natural oxide film before the partial etching step can be measured in advance. Thus, it is possible to determine the film thickness of the natural oxide film after the partial etching step. Further, the particles are modeled with spheres of a constant radius in contact with the substrate surface. Then, this makes it possible to determine, by calculation, the partial surface area of the portion taken inside the natural oxide film remaining on the substrate after the partial etching. The ratio of the partial surface area to the entire surface area, that is, the surface area ratio corresponds to the film thickness of the natural oxide film after the partial etching step, and thus, finally, corresponds to the etching conditions.

On the other hand, in FIG. 4B, the vertical axis denotes the particle removal ratio. The horizontal axis denotes the volume ratio of the particles in the portion taken into the natural oxide film (volume ratio within the oxide film). That is, it is the ratio of partial volume of the portion taken into the natural oxide film to the entire volume of the particles. This volume ratio corresponds to the etching conditions of the partial etching with the diluted hydrofluoric acid. That is, as described above, knowing the etching conditions allows the film thickness of the natural oxide film after the partial etching to be determined. Further, modeling the particles with spheres of a constant radius in contact with the substrate surface will make it possible to determine, by calculation, the partial volume of the portion taken inside the natural oxide film after the partial etching. The ratio of the partial volume to the entire volume, that is, the volume ratio corresponds to the film thickness of the natural oxide film after the partial etching step, and thus, finally, corresponds to the etching conditions.

In the same manner as mentioned above, for the physical cleaning step, such physical cleaning energy that enables damage to the pattern formed on the substrate to be suppressed or avoided was set. That is, the physical cleaning conditions in the physical cleaning step were set to be constant.

Figure 5:
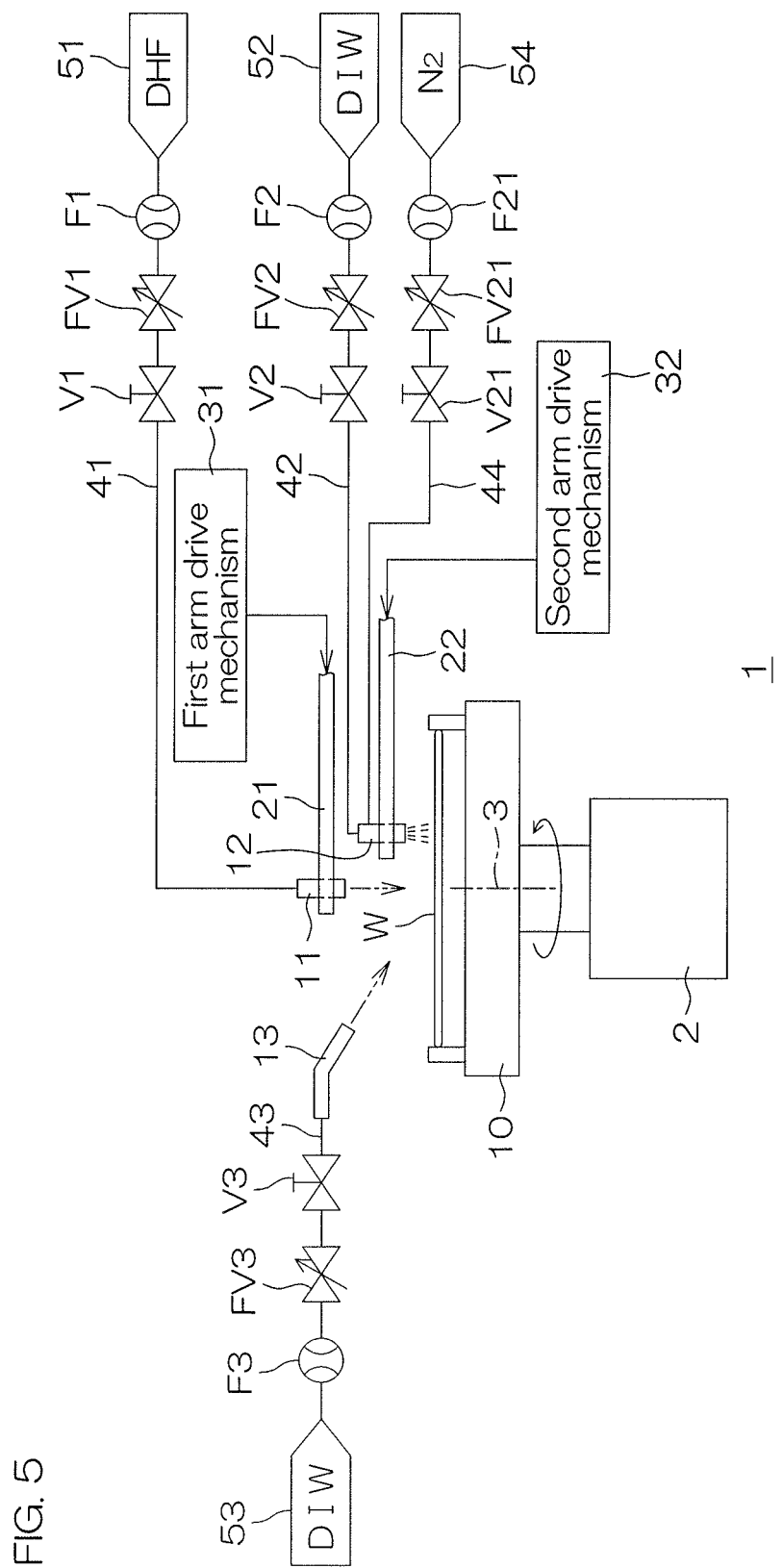
FIG. 5 is an explanatory conceptual diagram of a configuration example of a substrate processing apparatus to execute the aforementioned substrate cleaning processing.

It can be seen from FIG. 4A and FIG. 4B that the smaller the ratio of a portion taken into the natural oxide film (surface area or volume ratio), that is, the more the portion exposed from the natural oxide film, the greater the removal ratio becomes. That is, FIG. 4 and FIG. 5 illustrate that the etching of the natural oxide film leads to improvement in the particle removal ratio. Note that it was also shown by another experiment that only by the etching of the natural oxide film, that is, when the physical cleaning step is not followed, most particles are not removed.

FIG. 5 is an explanatory conceptual diagram illustrating a configuration example of a substrate processing apparatus that executes the substrate cleaning processing mentioned above. The substrate processing apparatus is of a single substrate processing type which processes substrates one by one. The substrate processing apparatus 1 is provided with a spin chuck 10, a first movable nozzle 11, a second movable nozzle 12, and a fixed nozzle 13.

The spin chuck 10 is a substrate holding mechanism that horizontally holds a substrate W to be processed. The spin chuck 10 is rotatable around a vertical rotational axial line 3. In order to rotate the spin chuck 10, there is provided an electric motor 2. The electric motor 2 is an example of a substrate rotational unit that rotates the substrate W. This configuration enables the substrate W to be horizontally held and rotated around the rotational axial line 3 passing through the center of the substrate W.

The first and second movable nozzles 11, 12 are each a processing fluid nozzle (a processing liquid nozzle in this preferred embodiment) which discharges a processing fluid (a processing liquid in this preferred embodiment) for processing the substrate W retained on the spin chuck 10. The first movable nozzle 11 and the second movable nozzle 12 are attached to a first scan arm 21 and a second scan arm 22, respectively. The first scan arm 21 and the second scan arm 22, which each extend horizontally, have the first and second movable nozzles 11, 12 secured to the tip portions of the arms, respectively.

The first and second scan arms 21, 22 are driven by first and second arm drive mechanisms 31, 32, respectively, thereby allowing the tip portions of the arms to be moved in the horizontal direction and vertical direction, respectively. The first and second movable nozzles 11, 12 are accordingly moved in the horizontal direction and the vertical direction, respectively. Thus, the first and second movable nozzles 11, 12 are movable to be closer to and away from the substrate W retained on the spin chuck 10, respectively, and each horizontally movable across the surface of the substrate W. More specifically, when the first movable nozzle 11 moves horizontally while discharging a processing liquid, the liquid arrival point on the upper surface of the substrate W moves within the range from the vicinity of the rotational center to the circumferential edge of the substrate W. Likewise, when the second movable nozzle 12 moves horizontally while discharging a processing liquid, the liquid arrival point on the upper surface of the substrate W moves within the range from the vicinity of the rotational center to the circumferential edge of the substrate W. This allows the processing liquid to scan the upper surface of the substrate W. With the spin chuck 10 being rotated to rotate the substrate W, the liquid arrival point of the processing liquid draws a spiral locus to scan across the upper surface of the substrate W. The first arm drive mechanism 31 may be provided with a horizontal travel unit which moves the first scan arm 21 in the horizontal direction and a vertical travel unit which moves the first scan arm 21 in the vertical direction. Likewise, the second arm drive mechanism 32 may be provided with a horizontal travel unit which moves the second scan arm 22 in the horizontal direction and a vertical travel unit which moves the second scan arm 22 in the vertical direction. The horizontal travel unit may include a swinging mechanism which allows the corresponding scan arms 21, 22 to swing about a vertical swinging axial line that is set to the proximal end portion of the arms, thereby moving the corresponding tip portion of the scan arms 21, 22 in the horizontal direction.

The first and second movable nozzles 11, 12 are also capable of discharging the processing liquid at respective fixed positions instead of scanning across the substrate surface with the processing liquid. Specifically, the first movable nozzle 11 is stopped at a processing position at which the processing liquid discharged from the first movable nozzle 11 arrives on the rotational axial line 3, that is, to the center of rotation of the substrate W. The first movable nozzle 11 at standstill is allowed to discharge the processing liquid to the center of rotation of the substrate W. The discharged processing liquid arrives on the surface of the substrate W and receives a centrifugal force to be spread outward on the rotating substrate W. This enables the entire surface of the substrate W to be processed with the processing liquid. The same holds true for the second movable nozzle 12.

In this preferred embodiment, the first movable nozzle 11 is used as an etching liquid nozzle which discharges a diluted hydrofluoric acid as an etching liquid. When the diluted hydrofluoric acid is supplied onto the surface of the substrate W, the substrate W is rotated while the first movable nozzle 11 is controlled to stop at the processing position mentioned above, and supplies the diluted hydrofluoric acid to the center of rotation of the substrate W. On the other hand, in this preferred embodiment, the second movable nozzle 12 has a form of a two-fluid nozzle which supplies a mixed fluid. When a mixed fluid is supplied, the substrate W is rotated while the second movable nozzle 12 is moved between the center of rotation and the outer circumference of the substrate W. This allows the mixed fluid to scan across the entire surface of the substrate W.

The fixed nozzle 13 is a processing fluid nozzle (processing liquid nozzle in this preferred embodiment) which discharges a processing fluid (processing liquid in this preferred embodiment) from a fixed position to the substrate W. The fixed nozzle 13 discharges the processing liquid to the vicinity of the center of the substrate W retained on the spin chuck 10. The processing liquid having reached the surface of the substrate W is spread on the upper surface of the substrate W. In particular, with the spin chuck 10 being rotated, the processing liquid is quickly spread on the entire area of the upper surface of the substrate W by a centrifugal force. In this preferred embodiment, the fixed nozzle 13 supplies DIW as a rinse liquid. Furthermore, the fixed nozzle 13 supplies DIW as a cover rinse liquid even when the second movable nozzle 12 supplies the mixed fluid to the substrate W. DIW covers the surface of the substrate W in a region to which at least the mixed fluid reaches so as to suppress the damage to the pattern that is caused by the mixed fluid directly reaching the surface of the substrate W.

The first movable nozzle 11 is coupled to a first processing liquid supply path 41. The first processing liquid supply path 41 is connected to a hydrofluoric acid supply source 51 (an etching liquid supply source). The first processing liquid supply path 41 has a first processing liquid valve V1 disposed in the path. It is possible to switch between the supply and the stop of the etching liquid (diluted hydrofluoric acid (DHF)) from the first movable nozzle 11 by opening/closing the first processing liquid valve V1. The first processing liquid supply path 41 has a first flowmeter F1 and a first flow rate control valve FV1 disposed in the path. The first flow rate control valve FV1 is, for example, a flow rate control valve with an electric motor and is capable of controlling the opening of the flow path. Thus, the first flow rate control valve FV1 can be controlled to adjust the supply flow rate of the etching liquid. The first flowmeter F1 monitors the flow rate of the etching liquid passing through the first processing liquid supply path 41, that is, the flow rate of the etching liquid discharged from the first movable nozzle 11.

The second movable nozzle 12 is coupled to the second processing liquid supply path 42. The second processing liquid supply path 42 is connected to DIW supply source 52 (a liquid supply source) which supplies DIW as an example liquid that constitutes the mixed fluid. The second processing liquid supply path 42 has a second processing liquid valve V2 disposed in the path. The second movable nozzle 12 further has a gas supply path 44 connected to the nozzle. The gas supply path 44 is connected to an inert gas supply source 54 (a gas supply source) which supplies an inert gas such as a nitrogen gas. The gas supply path 44 has an inert gas valve V21 disposed in the path. The second movable nozzle 12 mixes together DIW supplied from the second processing liquid supply path 42 and an inert gas supplied from the gas supply path 44 to produce a mixed fluid, a mixture of a gas and a liquid, and then supplies the resulting mixed fluid to the substrate W. The mixed fluid contains minute droplets, which are supplied to the substrate W in a current of the inert gas. The second processing liquid valve V2 and the inert gas valve V21 can be opened/closed, thereby switching between supply and stop of the mixed fluid.

The second processing liquid supply path 42 has a second flowmeter F2 and a second flow rate control valve FV2 disposed in the path. The second flow rate control valve FV2 is, for example, a flow rate control valve with an electric motor and is capable of controlling the opening of the flow path. It is thus possible to control the supply flow rate of DIW by controlling the second flow rate control valve FV2. The second flowmeter F2 monitors the flow rate of DIW passing through the second processing liquid supply path 42, that is, the flow rate of DIW supplied to the second movable nozzle 12.

The gas supply path 44 has an inert gas flowmeter F21 and an inert gas flow rate control valve FV21 disposed in the path. The inert gas flow rate control valve FV21 is, for example, is a flow rate control valve with an electric motor, and is capable of controlling the opening of the flow path. It is thus possible to control the supply flow rate of an inert gas by controlling the inert gas flow rate control valve FV21. The inert gas flowmeter F21 monitors the flow rate of the inert gas passing through the gas supply path 44, that is, the flow rate of the inert gas supplied to the second movable nozzle 12.

The mixed fluid discharged from the second movable nozzle 12 in a form as the two-fluid nozzle has the mechanical energy that mainly depends on the flow rate of an inert gas. In this context, the flow rate of DIW passing through the second processing liquid supply path 42 is set to a constant value, and the flow rate of an inert gas passing through the gas supply path 44 is controlled depending on the energy required, thereby achieving the physical cleaning by the mixed fluid having appropriate energy.

The fixed nozzle 13 is coupled to a third processing liquid supply path 43. The third processing liquid supply path 43 is connected to a rinse liquid supply source 53. The rinse liquid supply source 53 supplies a rinse liquid such as DIW or carbonated water. The third processing liquid supply path 43 has a third processing liquid valve V3 disposed in the path. It is possible to switch between the supply and the stop of the rinse liquid by opening/closing the third processing liquid valve V3. The third processing liquid supply path 43 has a third flowmeter F3 and a third flow rate control valve FV3 disposed in the path. The third flow rate control valve FV3 is, for example, a flow rate control valve with an electric motor, and is capable of controlling the opening of the flow path. It is thus possible to control the supply flow rate of the rinse liquid by controlling the third flow rate control valve FV3. The third flowmeter F3 monitors the flow rate of the rinse liquid passing through the third processing liquid supply path 43, that is, the flow rate of the rinse liquid discharged from the fixed nozzle 13.

Figure 6:
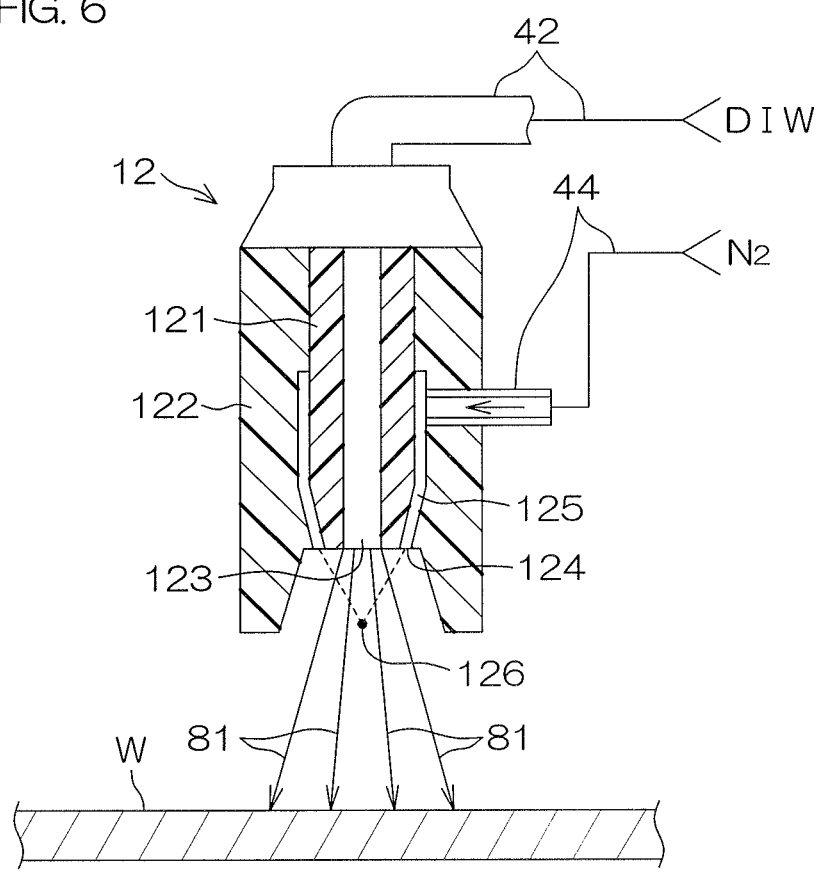
FIG. 6 is a longitudinal sectional view illustrating a configuration example of a two-fluid nozzle that is provided in the substrate processing apparatus.

FIG. 6 is a longitudinal sectional view illustrating a configuration example of the two-fluid nozzle (hereafter, may be referred to as "two-fluid nozzle 12") that constitutes the second movable nozzle 12. The two-fluid nozzle 12 mixes two types of fluids (a gas and a liquid) to thereby produce fine droplets. The two-fluid nozzle 12 includes a cylindrical inner nozzle member 121 and an outer nozzle member 122 disposed therearound. A liquid supply pipe that constitutes the second processing liquid supply path 42 is connected to the inner nozzle member 121, while a gas supply pipe that constitutes the gas supply path 44 is connected to the outer nozzle member 122. There is provided a liquid jet outlet 123 at the lower end of the inner nozzle member 121, and the liquid jet outlet 123 is located to oppose the surface (upper surface) that is the surface to be processed of the substrate W. Thus, a liquid (DIW) supplied from the second processing liquid supply path 42 is jetted to the surface of the substrate W from the liquid jet outlet 123.

On the other hand, there is formed a gap 125 between the inner nozzle member 121 and the outer nozzle member 122, the gap 125 communicating with the gas supply path 44. The gap 125 has a gas jet outlet 124 that is opened annularly around the liquid jet outlet 123. The diameter and radial width of the gap 125 are reduced toward the liquid jet outlet 123, thereby causing an inert gas supplied from the gas supply path 44 to be jetted through the gas jet outlet 124.

The jetted inert gas travels so as to converge at a mixture point 126 spaced apart by a predetermined distance from the liquid jet outlet 123, and is then mixed at the mixture point 126 with a jetted liquid from the liquid jet outlet 123. This mixture turns DIW in a liquid phase to fine droplets, and the resulting fine droplets are accelerated by the inert gas so as to be directed to the substrate W as high-speed droplets. That is, the mixed fluid 81, which is formed of the fine droplets of DIW and the high-speed flow of the inert gas, is supplied to the surface of the substrate W.

The fine droplets contained in the mixed fluid 81 supplied to the surface of the substrate W in this manner collide with the surface of the substrate W at a high speed. The kinetic energy of the fine droplets makes it possible to physically remove particles on the surface of the substrate W.

The two-fluid nozzle 12 illustrated in FIG. 6 is a so-called external mixture type two-fluid nozzle which mixes a liquid and an inert gas outside the nozzle to produce fine droplets. In place of such an external mixture type two-fluid nozzle, an internal mixture type two-fluid nozzle, which mixes a gas and a liquid inside the nozzle, may be employed.

Figure 7:
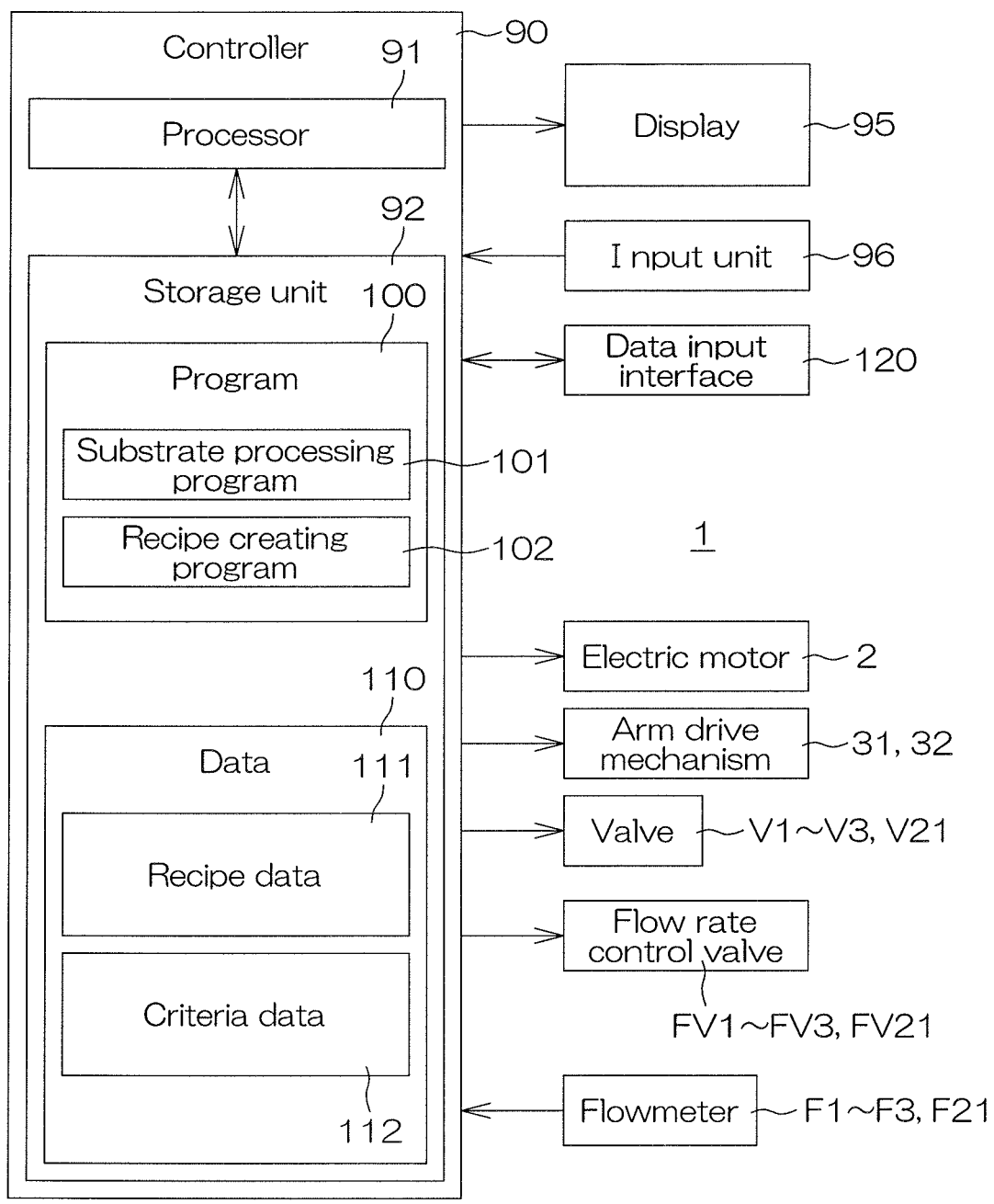
FIG. 7 is an explanatory block diagram illustrating an electrical configuration of the substrate processing apparatus.

FIG. 7 is an explanatory block diagram illustrating an electrical configuration of the substrate processing apparatus. The substrate processing apparatus 1 is provided with a controller 90. The controller 90 has a basic configuration as a computer. The controller 90 is an example of control means to control those controllable resources that are provided in the substrate processing apparatus 1. The controllable resources include the electric motor 2 (a spin motor) to rotate the spin chuck 10, the first arm drive mechanism 31, and the second arm drive mechanism 32. The controllable resources further include the open/close valves V1 to V3, V21, and the flow rate control valves FV1 to FV3, FV21. The controller 90 also receives output signals from various types of sensors including the flowmeters F1 to F3, F21.

The controller 90 is provided with a processor (CPU) 91 and a storage unit 92. The storage unit 92 may include memory (including ROMs and RAMS) or a large-capacity storage device (HDDs, SDDs, etc.). A display 95 and an input unit 96 are connected to the controller 90. The input unit 96, such as a keyboard or a pointing device, is operated by the user to input commands or information to the controller 90, and an example of command input means.

Stored in the storage unit 92 are, for example, a program 100 to be executed by the processor 91 and data 110 such as recipe data 111 that describes the substrate processing procedure.

The program 100 includes a substrate processing program 101 which controls the resources of the substrate processing apparatus 1 on the basis of recipe data 111 to thereby achieve processing for the substrate W. The program 100 may include a recipe creating program 102 to create the recipe data 111.

The recipe data 111 includes step data indicative of a plurality of steps that describe the processing procedures for the substrate W. The data 110 stored in the storage unit 92 includes criteria data 112 in addition to the recipe data 111. The criteria data 112 is reference data which is referred to when the recipe data 111 is created and which is employed to match processing conditions for a plurality of processes. More specifically, the criteria data 112 includes reference data indicating the matching relationship between the etching conditions specified by step data for the partial etching step and the physical cleaning conditions specified by step data for the physical cleaning step. The storage unit 92 is an example of recipe data storage means and an example of criteria data storage means.

The criteria data 112 is prepared in advance and stored in the storage unit 92. Specifically, found on the basis of various combinations between an etching condition and a physical cleaning condition is the matched relationship between the conditions, on the basis of which the criteria data 112 is created. More specifically, while the physical cleaning energy is set within the range in which no damage to the pattern occurs or damage to the pattern is allowable, various etching conditions are set to attempt the substrate cleaning (partial etching step and the physical cleaning step) a plurality of times. For each attempt, the particle removal ratio is determined. This leads to the result as illustrated in FIG. 3. Further, within the range in which the particle removal ratio is acceptable, the etching conditions that match the physical cleaning energy are specified. While the physical cleaning energy is varied in a variety of ways within the range in which no damage to the pattern occurs or damage to the pattern is allowable, an etching condition that matches each energy can be determined. It would be then possible to acquire the criteria data 112 indicating the matched relationship between the etching condition and the physical cleaning energy.

Figure 14:
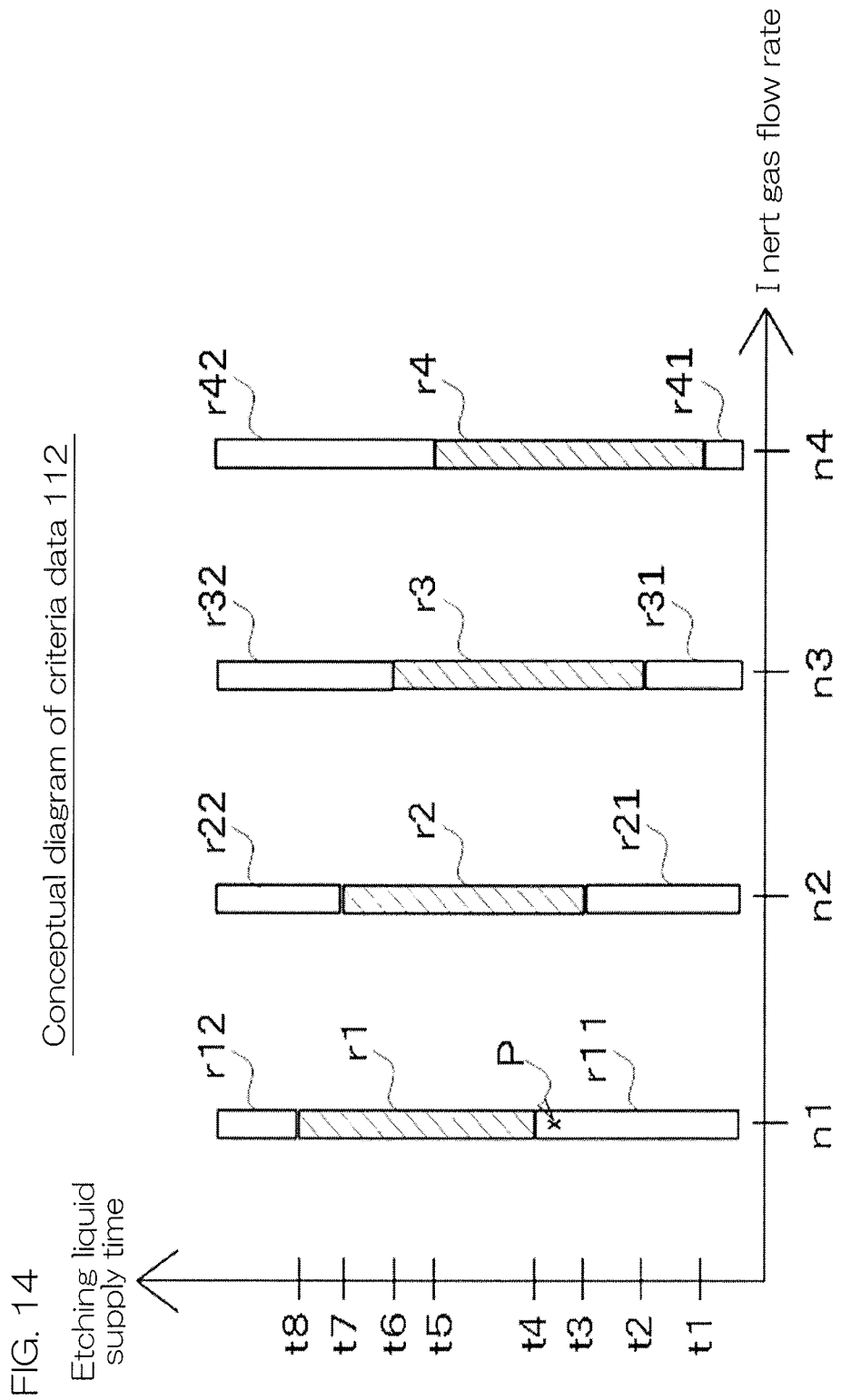
FIG. 14 is a view illustrating a graph for denoting the concept of criteria data.

FIG. 14 is a graph showing the concept of the criteria data 112. FIG. 14 is a graph with the horizontal axis denoting the flow rate of an inert gas supplied to the two-fluid nozzle 12 (i.e., the opening of the inert gas flow rate control valve FV21) and the vertical axis denoting the supply time of a diluted hydrofluoric acid supplied from the first movable nozzle 11 to the substrate W (i.e., the opening time of the first processing liquid valve V1). It is to be understood that damage to the pattern formed on the substrate W can be suppressed or avoided if the physical cleaning is conducted within the range of inert gas flow rates n1 to n4. In this graph, the time ranges denoted by r1, r2, r3 and r4 (hereafter to be referred to as the appropriate etching time ranges) show the range of supply times of the diluted hydrofluoric acid which enables a desired particle removal ratio to be achieved while damage to the pattern formed on the substrate W is suppressed or avoided. For example, suppose that the flow rate of an inert gas supplied to the two-fluid nozzle 12 is n1. Then, if the diluted hydrofluoric acid is supplied within the range of times t4 to t8, the desired particle removal ratio can be achieved while damage to the pattern formed on the substrate W is suppressed or avoided. However, with the supply time for the diluted hydrofluoric acid being below t4 (for range r11), the desired particle removal ratio cannot be achieved. Conversely, the supply time for the diluted hydrofluoric acid being above t8 leads to an excessive etching. Thus, for the inert gas flow rate being n1, the etching may be conducted within the time range r1.

The upper limit and the lower limit of the appropriate etching time ranges r1 to r4 vary in conjunction with the flow rate of the inert gas. That is, as illustrated in FIG. 14, the upper limit (t5, t6, t7, t8) and the lower limit (t1, t2, t3, t4) of the appropriate etching time ranges r1 to r4 decrease with increasing flow rate of the inert gas.

In the foregoing, the concept of the criteria data 112 is described only in terms of the correlation between the flow rate of the inert gas and the supply time of the diluted hydrofluoric acid. However, the actual criteria data 112 may include a matched relationship in combination with various etching conditions and physical cleaning conditions. For example, as such a combination, conceivable are a combination of the flow rate of the inert gas and the supply time and/or the supply flow rate of the diluted hydrofluoric acid or a combination of the flow rate and/or the supply time of the inert gas and the supply time and/or the supply flow rate of the diluted hydrofluoric acid.

Furthermore, FIG. 14 illustrates the inert gas flow rate as discrete data (n1, n2, n3, and n4); however, the criteria data 112 may be continuous inert gas flow rate data by supplementing the trial results, as appropriate.

FIG. 8 illustrates an example of recipe data for executing the substrate cleaning processing as mentioned above. The step data of each step constituting the recipe includes, for example, descriptions relating to processing conditions such as a step number, a jump destination step, a substrate rotational speed (rpm), a processing time (sec), first to fourth valves, first to fourth flow rates, and nozzle control 1, 2. In principle, processing is executed on the basis of the step number; when a sequential order that does not follow the step number is specified, the step number of the next step is described in the column of the jump destination step. The substrate rotational speed is the rotational speed at which the spin chuck 10 is rotated to thereby rotate the substrate W. The processing time is the time of the step, and for example, denotes the time for which the rotational speed of the spin chuck 10 is maintained at the specified rotational speed. In the columns of the first to fourth valves, those valves to be controlled are entered. In the columns of the first to fourth flow rates, the flow rates of processing fluids passing through the respective first to fourth valves are entered.

In the example of FIG. 8, the step number 1 shows the step in which the substrate W starts to rotate. In this example, the rotational speed of the substrate W is accelerated up to 1000 rpm.

The step number 2 specifies the partial etching step in which the diluted hydrofluoric acid is supplied to the substrate W. In this example, the rotational speed of the substrate W is controlled to 1000 rpm. As the first valve, the first processing liquid valve V1 is specified. That is, in the step number 2, the control operation of opening the first processing liquid valve V1 is specified. Also specified is the flow rate corresponding to the first processing liquid valve V1, that is, the flow rate of the diluted hydrofluoric acid passing through the first processing liquid supply path 41. In this example, the flow rate is 500 milliliters/min. Furthermore, the processing time is specified to 60 seconds. For "the nozzle control 1," specified is the nozzle travel control by which the first movable nozzle 11 is stopped at the center of the substrate W. Thus, when the step number 2 is executed, the controller 90 controls the first arm drive mechanism 31 so as to locate and stop the first movable nozzle 11 above the center of rotation of the substrate W. Further, with the substrate W being rotated at 1000 rpm, the first processing liquid valve V1 is opened. This causes the first movable nozzle 11 to supply the diluted hydrofluoric acid to the center of rotation of the surface of the substrate W. The flow rate of the diluted hydrofluoric acid at that time is controlled to 500 milliliters/min by the controller 90 controlling the flow rate control valve FV1 while monitoring the output of the flowmeter F1. In this condition, the diluted hydrofluoric acid is supplied to the surface of the substrate W for 60 seconds.

The step number 3 denotes the rinsing processing step in which a chemical solution (diluted hydrofluoric acid) on the upper surface of the substrate W is washed away with the rinse liquid (e.g., DIW). In this example, the rotational speed of the substrate W is controlled to 1000 rpm. As the first valve to be controlled, the third processing liquid valve V3 is registered. Furthermore, the flow rate of the rinse liquid passing through the third processing liquid supply path 43 is specified. In this example, the flow rate is 1500 milliliters/min. In accordance with these specified flow rates, the output of the flowmeter F3 is monitored so as to accordingly control a flow rate control valve FV3. The processing time is set to 15 seconds. Thus, the rinsing processing with the rinse liquid is to be performed for 15 seconds.

The step number 4 specifies the step of performing the physical cleaning on the substrate W using the mixed fluid discharged from the two-fluid nozzle. In this example, the rotational speed of the substrate W is controlled to 1000 rpm. The second processing liquid valve V2 is specified as the first valve; the inert gas valve V21 is specified as the second valve; and the third processing liquid valve V3 is specified as the third valve. That is, in the step number 4, the control operation of opening the second processing liquid valve V2, the inert gas valve V21, and the third processing liquid valve V3 is specified. Further, the flow rate corresponding to the second processing liquid valve V2, that is, the flow rate of DIW passing through the second processing liquid supply path 42 is specified. In this example, the flow rate is 100 milliliters/min. Also the flow rate corresponding to the inert gas valve V21, that is, the flow rate of an inert gas passing through the gas supply path 44 is specified. In this example, the flow rate is 20000 milliliters/min. Still furthermore, the flow rate corresponding to the third processing liquid valve V3, that is, the flow rate of the rinse liquid (e.g., DIW) passing through the third processing liquid supply path 43 is specified. In this example, the flow rate is 200 milliliters/min. Furthermore, the processing time is specified 60 seconds. As "the nozzle control 1," specified is the scan operation by which the second movable nozzle 12 moves between the center of rotation and the outer circumferential edge of the substrate W. Thus, when the step number 4 is executed, the controller 90 controls the second arm drive mechanism 32 so as to reciprocate the second movable nozzle 12A along the surface of the substrate W. Further, in the condition in which the substrate W is rotated at 1000 rpm, the second processing liquid valve V2, the inert gas valve V21, and the third processing liquid valve V3 are opened. This causes the second movable nozzle 12 (two-fluid nozzle) to supply the mixed fluid to the center of rotation of the surface of the substrate W and the fixed nozzle 13 to supply the rinse liquid to the center of rotation of the surface of the substrate W. The flow rate of DIW supplied to the second movable nozzle 12 (two-fluid nozzle) is controlled to 100 milliliters/min by the controller 90 controlling the flow rate control valve FV2 while monitoring the output of the flowmeter F2. Furthermore, the flow rate of an inert gas is controlled to 20000 milliliters/min by the controller 90 controlling the flow rate control valve FV21 while monitoring the output of the flowmeter F21. In this condition, the second movable nozzle 12 supplies the mixed fluid to the surface of the substrate W for 60 seconds while scanning across the surface of the substrate W. Furthermore, the controller 90 controls the flow rate of the rinse liquid supplied from the fixed nozzle 13 to 200 milliliters/min by controlling the flow rate control valve FV3 while monitoring the output of the flowmeter F3.

The step number 5 is the rinsing processing step of washing away foreign matter, which is left on the substrate W after the physical cleaning processing with the mixed fluid, with the rinse liquid (e.g., DIW). In this example, the rotational speed of the substrate W is controlled to 1000 rpm. As the first valve to be controlled, registered is the third processing liquid valve V3. Also, the flow rate of the rinse liquid passing through the third processing liquid supply path 43 is specified. In this example, the flow rate is 1500 milliliters/min. In accordance with the specified flow rates, the output of the flowmeter F3 is monitored, the flow rate control valve FV3 is accordingly controlled. The processing time is set to 15 seconds. Thus, the rinsing processing with the rinse liquid is to be performed for 15 seconds.

The step number 6 is the spin drying step of shaking off the liquid component on the upper surface and the lower surface of the substrate W by the substrate W being rotated at a high speed. In this example, the rotational speed of the substrate W is specified to 2500 rpm. The processing time is set to 15 seconds.

The step number 7 is the step of stopping the rotation of the substrate W, with the rotational speed of the substrate W specified to 0 rpm.

A recipe data creating function of creating recipe data as mentioned above is provided by the processor 91 executing the recipe creating program 102 in the controller 90. The user can use this recipe data creating function to create recipe data while using the display 95 and the input unit 96 as a man-machine interface. Specifically, step data can be created through an operation to describe a processing condition for individual steps, thereby creating recipe data that includes a plurality of pieces of step data. The created recipe data is registered with the storage unit 92.

Figure 9:
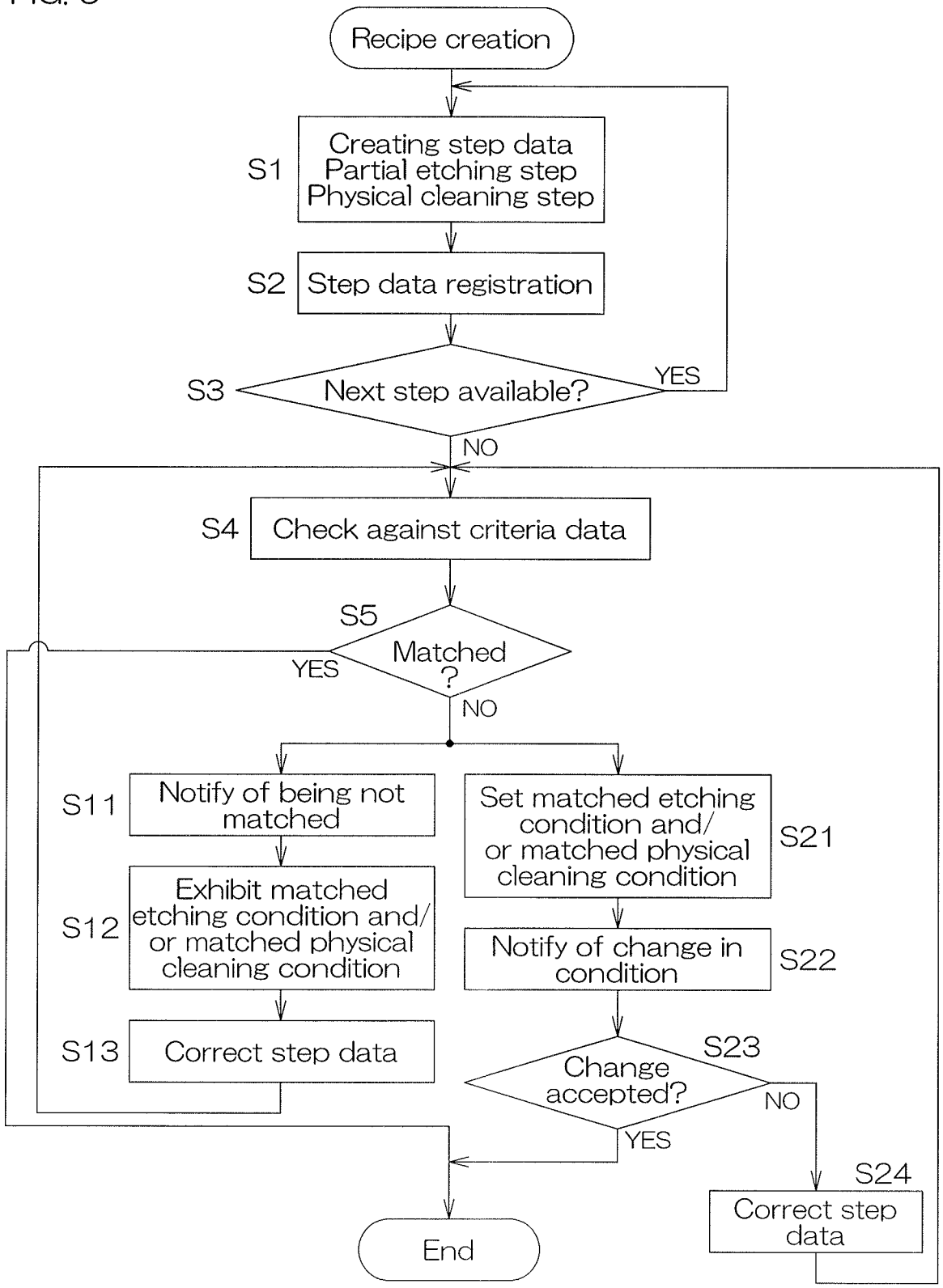
FIG. 9 is an explanatory flowchart showing a specific example of creating recipe data for executing the aforementioned substrate cleaning method.

FIG. 9 is an explanatory flowchart for a specific example of creating recipe data to execute the substrate cleaning method mentioned above. This processing is provided by the processor 91 executing the recipe creating program 102.

The user operates the input unit 96 to activate the recipe creating program 102 and starts to create recipe data. In creating the recipe data, the user repeats the operation of creating and registering step data indicating steps that construct the recipe data (S1, S2, S3). That is, in the case of the recipe data of FIG. 8, step data of the step numbers 1 to 7 is sequentially created. Creating the step data of the step number 2 corresponds to creating the step data of the partial etching step. Furthermore, creating the step data of the step number 4 corresponds to creating the step data of the physical cleaning step. Thus, by the processor 91 executing the recipe creating program 102, provided as the partial etching step creating means is the function of creating the step data of the partial etching step in response to the command input from the input unit 96. Likewise, by the processor 91 executing the recipe creating program 102, provided as the physical cleaning step creating means is the function of creating the step data for executing the physical cleaning step in response to a command input from the input unit 96. Note that the sequential order of creating recipe data does not necessarily need to follow the step number.

If the user finishes creating and then registering all step data that constitutes recipe data (S3: YES), the processor 91 checks the created recipe data against the criteria data 112 (S4). More specifically, it is determined whether the etching conditions denoted by the step data of the partial etching step (step number 2 in the example of FIG. 8) and the physical cleaning conditions denoted by the step data of the physical cleaning step (step number 4 in the example of FIG. 8) are matched with the contents of the criteria data 112. If it is determined to be matched (S5: YES), then the processor 91 ends the recipe data creating processing.

Referring to FIG. 14, the determination step of step S5 will be specifically explained. The processor 91 acquires data on the supply flow rate of the diluted hydrofluoric acid in the partial etching step from the data of the step number 2 registered by the operator in step S2. Furthermore, the processor 91 also acquires data on the supply flow rate of an inert gas in the physical cleaning step from data of the step number S4 registered by the operator in step S2. It is then determined whether the combination of the supply time of the etching liquid and the supply flow rate of the inert gas is included in any one of the appropriate etching time ranges r1 to r4 in the criteria data 112 illustrated in FIG. 14. If the combination is included in any one of the appropriate etching time ranges r1 to r4, the processor 91 determines that the etching conditions and the physical cleaning condition registered by the operator in step S2 are matched with the contents of the criteria data 112 (S5: YES). On the other hand, if the combination is not included in any one of the appropriate etching time ranges r1 to r4, the processor 91 determines that the etching conditions and the physical cleaning conditions registered by the operator in step S2 are not matched with the contents of the criteria data 112 (S5: NO).

If it is determined to be not matched, the processing for correcting the recipe data is performed. FIG. 9 shows two examples of processing for correcting the recipe data.

In the first processing example (S11 to S13), the processor 91 urges the user to correct recipe data, and in response to this, the user operates the input unit 96 to correct the recipe data. More specifically, the processor 91 notifies the user of the recipe data being not matched (S11). For example, this notification can be made by indicating the notification display of being not matched on the display 95. The processor 91 also presents, to the user, a physical cleaning condition that matches an etching condition, an etching condition that matches a physical cleaning condition, or both the conditions (S12). This presentation can also be made by being displayed on the display 95. In response to this presentation, the user operates the input unit 96, thereby correcting the step data of the partial etching step, the step data of the physical cleaning step, or both pieces of step data (S13). After that, again, the recipe data is checked against the criteria data 112 (S4). In this manner, the recipe data that matches the criteria data 112 can be created and registered with the storage unit 92.

In the second processing example (S21 to S24), the processor 91 corrects the recipe data so as to match the criteria data 112 and requires the user to approve that correction. More specifically, in order for the recipe data to match the criteria data, the processor 91 corrects the step data of the partial etching step, the step data of the physical cleaning step, or both pieces of step data (S21). For example, in the case where the condition specified by the operator is the condition denoted by the point P in FIG. 14, the processor 91 changes the diluted hydrofluoric acid supply time to t4 or greater so as to re-set the step data of the partial etching step. Alternatively, the processor 91 changes the flow rate of the inert gas to n2 so as to re-set the step data of the physical cleaning step. Still alternatively, the processor 91 corrects both the diluted hydrofluoric acid supply time and the inert gas so as to re-set the step data of the partial etching step and the physical cleaning step.

Then, the processor 91 notifies the user of the changes of the step data, that is, the changes of the etching conditions and/or the physical cleaning conditions (S22) so as to require the user to approve those changes (S23). The notification to the user can be made by displaying messages, etc., on the display 95. At this time, it is also acceptable to notify the user that the recipe data having been set by the user is not matched with the criteria data 112. The user can operate the input unit 96, thereby approving the changes (S23: YES). This allows the processor 91 to complete the recipe data creating process. On the other hand, the user can also operate the input unit 96 to disapprove the change of the recipe data (S23: NO). In this case, the user corrects the recipe data (S24). More specifically, the user corrects the step data of the partial etching step, the step data of the physical cleaning step, or both pieces of step data (S21). After that, again, the recipe data is checked against the criteria data 112 (S4). Such processing is repeated to thereby create the recipe data that matches the criteria data 112 and register the resulting data with the storage unit 92.

As described above, according to the substrate cleaning method of this preferred embodiment, the natural oxide film 70 on the surface of the substrate W is partially etched to a predetermined film thickness. That is, the surface portion 71 of the natural oxide film 70 is etched, thereby causing the natural oxide film 70 (72) of a predetermined film thickness to be left. The surface portion 71 of the natural oxide film 70 is etched, thereby causing particles P partially or entirely taken into the natural oxide film 70 to be exposed, leading to an increase in the ratio of the exposed portion. Thus, when the physical cleaning is executed after that, it is possible to remove the particles P with relatively small energy. In this manner, since the required particle removal performance can be achieved by the physical cleaning with small energy, it is possible suppress or avoid damage to the pattern formed on the surface of the substrate W.

Furthermore, since the surface portion 71 of the natural oxide film 70 is selectively etched, no detrimental effects are exerted on the underlayer beneath the natural oxide film 70. Thus, it is possible to remove particles on the substrate without exerting detrimental effects on the underlayer.

More specifically, in this preferred embodiment, the diluted hydrofluoric acid is employed in the partial etching step. Removing the entire natural oxide film 70 with the diluted hydrofluoric acid is not preferable because there is a possibility of causing roughness on the surface of the substrate W. In this context, the natural oxide film 70 can be partially etched to some midpoint of the film thickness, thereby removing the particles P on the substrate W, with the surface of the substrate W maintained in a good condition while damage to the pattern is suppressed or avoided.

On the other hand, since the diluted hydrofluoric acid has a concentration of 0.1% to 0.5%, the partial etching (light etching) of the natural oxide film 70 can be performed with a high accuracy. This enables removal of the particles P on the substrate W, with the surface of the substrate W maintained in a good condition while damage to the pattern is suppressed or avoided.

Furthermore, in this preferred embodiment, the recipe data 111 for executing the aforementioned substrate cleaning method is created. The recipe data 111 is registered with the substrate processing apparatus 1, so that the substrate processing apparatus 1 is operated in accordance with the recipe data 111, thereby allowing the aforementioned substrate cleaning method to be executed. The etching condition of the partial etching step and the physical cleaning condition of the physical cleaning step are matched on the basis of the criteria data 112. Since this enables creating the recipe data 111 with the etching condition and the physical cleaning condition being matched, it is possible to create the recipe data that makes it possible to achieve an appropriate substrate cleaning processing as a whole, that is, a substrate cleaning processing that achieves a required particle removal performance while damage to the pattern is suppressed or avoided.

Furthermore, in this preferred embodiment, at the stage of creating recipe data, a physical cleaning condition that matches an etching condition in the partial etching step, an etching condition that matches a physical cleaning condition in the physical cleaning step, or both of the conditions are presented to the user. This facilitates creating the partial etching step data and the physical cleaning step data that include an etching condition and a physical cleaning condition that are mutually matched, respectively.

Figure 10:
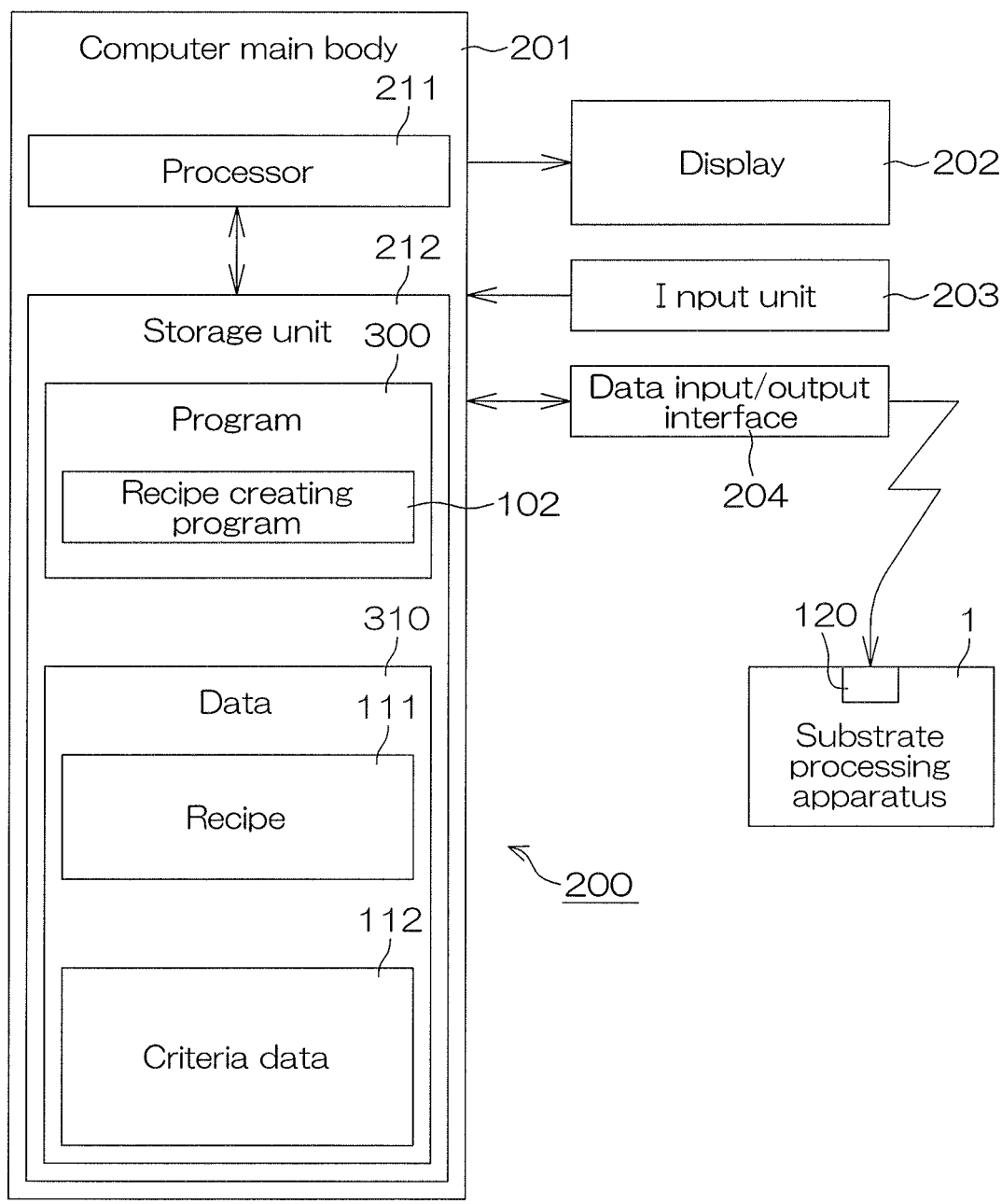
FIG. 10 is an explanatory block diagram illustrating another preferred embodiment of the present invention.

FIG. 10 is an explanatory block diagram illustrating another preferred embodiment of the present invention. In the description of this preferred embodiment, FIG. 1 to FIG. 9 will be referred to again. In FIG. 10, the same reference signs are given to the programs and data that have contents equivalent to those of the programs and data shown in FIG. 7 above.

In this preferred embodiment, the recipe data 111 is created by a computer system 200 that is provided separately from the substrate processing apparatus 1. Further, the created recipe data 111 is registered with the substrate processing apparatus 1.

In order to register the recipe data 111, the substrate processing apparatus 1 is provided with a data input interface 120 (also see FIG. 7). The data input interface 120 may be a reader unit for reading a recording medium in which the recipe data 111 is stored. The recording medium may be, for example, an optical disk or a magnetic disk, or portable memory such as a USB memory or a memory card. The data input interface 120 may include a communication unit. That is, for example, the recipe data 111 may be registered with the substrate processing apparatus 1 via the data input interface 120 from a network.

The computer system 200 is provided with a computer main body 201, a display 202, an input unit 203, and a data input/output interface 204. The input unit 203, such as a keyboard, a pointing device or the like, is a device for a user to input into the computer main body 201, and an example of command input means. The computer main body 201 is provided with a processor 211 and a storage unit 212. The processor 211 is provided with a CPU, etc. The storage unit 212 may include a memory device (including ROMs and RAMs) or a large-capacity storage unit (HDDs, SDDs, etc.). The storage unit 212 stores programs 300 executed by the processor 211 and various pieces of data 310. Various pieces of data 310 include the recipe data 111 and the criteria data 112.

The program 300 may include the recipe creating program 102 for creating the recipe data 111.

The data input/output interface 204 may be a reader/writer unit which writes/reads data on a writable and readable recording medium. The recording medium may be, for example, an optical disk or magnetic disk, or a portable memory device such as a USB memory or memory cards. The data input/output interface 204 may include a communication unit. That is, for example, data may be input or output via a network.

The recipe data 111 stored in the storage unit 212 includes step data indicating a plurality of steps that describe the processing procedures for the substrate W.

The recipe creating program 102 can be executed by the processor 211, thereby allowing the computer system 200 to create the recipe data 111 and store the resulting data on the storage unit 212. For example, it is also possible to create recipe data on another computer, etc., acquire the recipe data via the data input/output interface 204, store the resulting data on the storage unit 212, and edit the data as required.

The operation to create the recipe data 111 is the same as the operation that has been described referring to FIG. 9 above. However, in this preferred embodiment, the assistance function to create recipe data is provided by the processor 211 of the computer system 200.

In this manner, the recipe data 111 created by the computer system 200 in advance is registered with the substrate processing apparatus 1. Thus, the controller 90 of the substrate processing apparatus 1 does not need to include a recipe creating program. Furthermore, the criteria data 112 needs not be stored in the storage unit 92 of the substrate processing apparatus 1.

As described above, according to this preferred embodiment, it is thus possible to create the recipe data 111 in the computer system 200 that is separate from the substrate processing apparatus 1.

Figure 11:
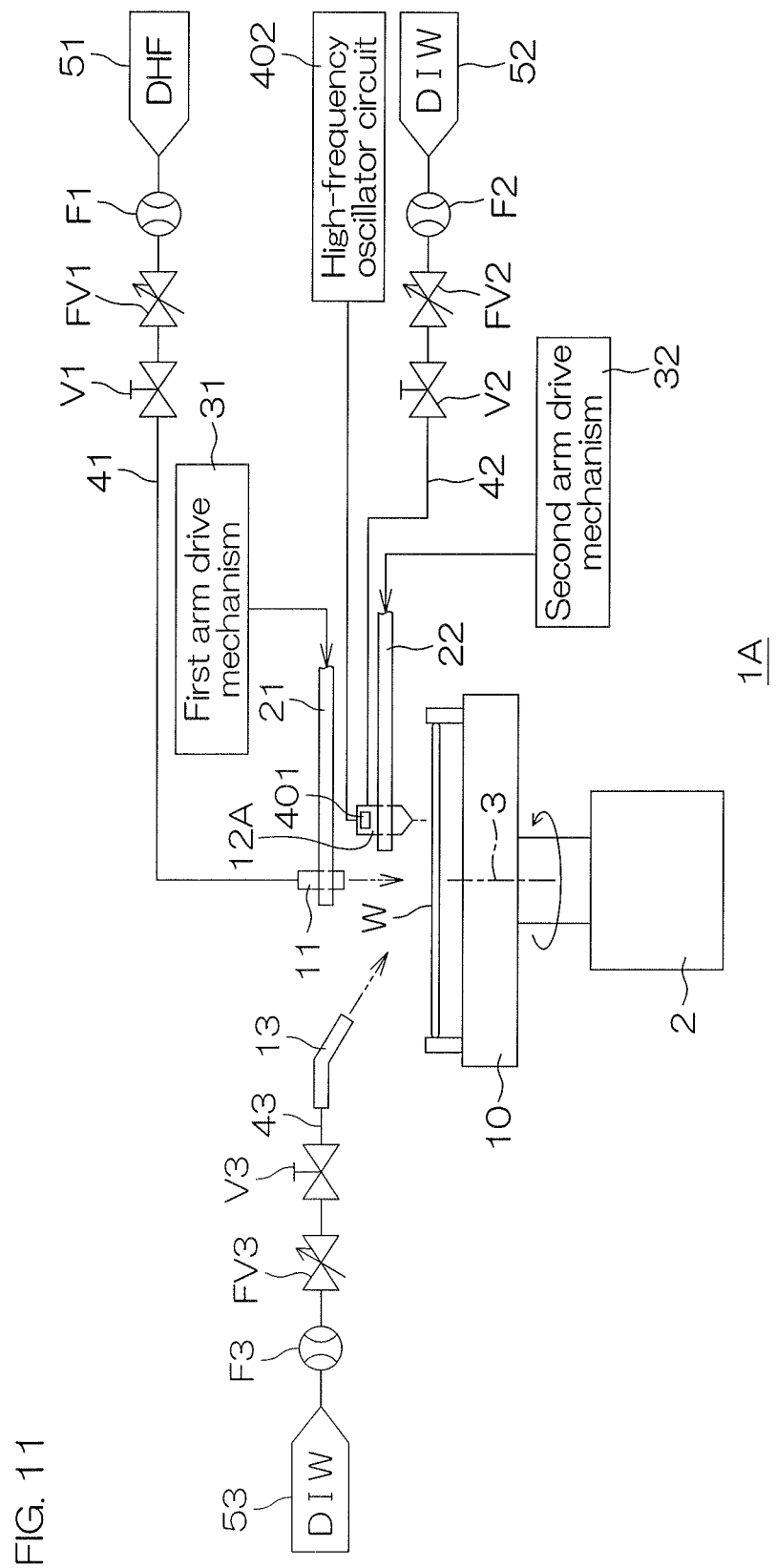
FIG. 11 is an explanatory conceptual diagram illustrating the configuration of a substrate processing apparatus according to a still another preferred embodiment of the present invention.

FIG. 11 is an explanatory conceptual diagram illustrating the configuration of the substrate processing apparatus 1A according to still another preferred embodiment of the present invention. In FIG. 11, the same portions as those illustrated in FIG. 5 are given the same reference signs. In this preferred embodiment, as the physical cleaning means, in place of the two-fluid nozzle, the second movable nozzle 12A composed of an ultrasonic nozzle is provided. The second movable nozzle 12A is coupled to the second processing liquid supply path 42, and is arranged to receive DIW supplied from the DIW supply source 52. There is disposed a vibration plate 401 so as to oppose the processing liquid flow path through which DIW passes in the second movable nozzle 12A. The vibration plate 401 is driven by a drive signal produced by a high-frequency oscillator circuit 402, and vibrated at ultrasonic frequency. This allows ultrasonic vibrations to be given to DIW passing through the second movable nozzle 12A, so that DIW provided with the ultrasonic vibration is supplied to the surface of the substrate W. Thus, the ultrasonic vibration propagates to the substrate W and particles existing on the surface of the substrate W, thereby causing the particles to be separated from the surface of the substrate W. In this manner, ultrasonic cleaning step of supplying a liquid provided with the ultrasonic vibration onto the surface of the substrate W is executed as the physical cleaning step. The physical cleaning energy in this case is controlled by adjusting the amplitude of the ultrasonic vibration, that is, the output of the high-frequency oscillator circuit 402. Note that a detailed example structure of the ultrasonic nozzle is disclosed, for example, in Japanese Patent Application Publication No. 2015-65355 and Japanese Patent Application Publication No. 2013-214757.

Figure 12:
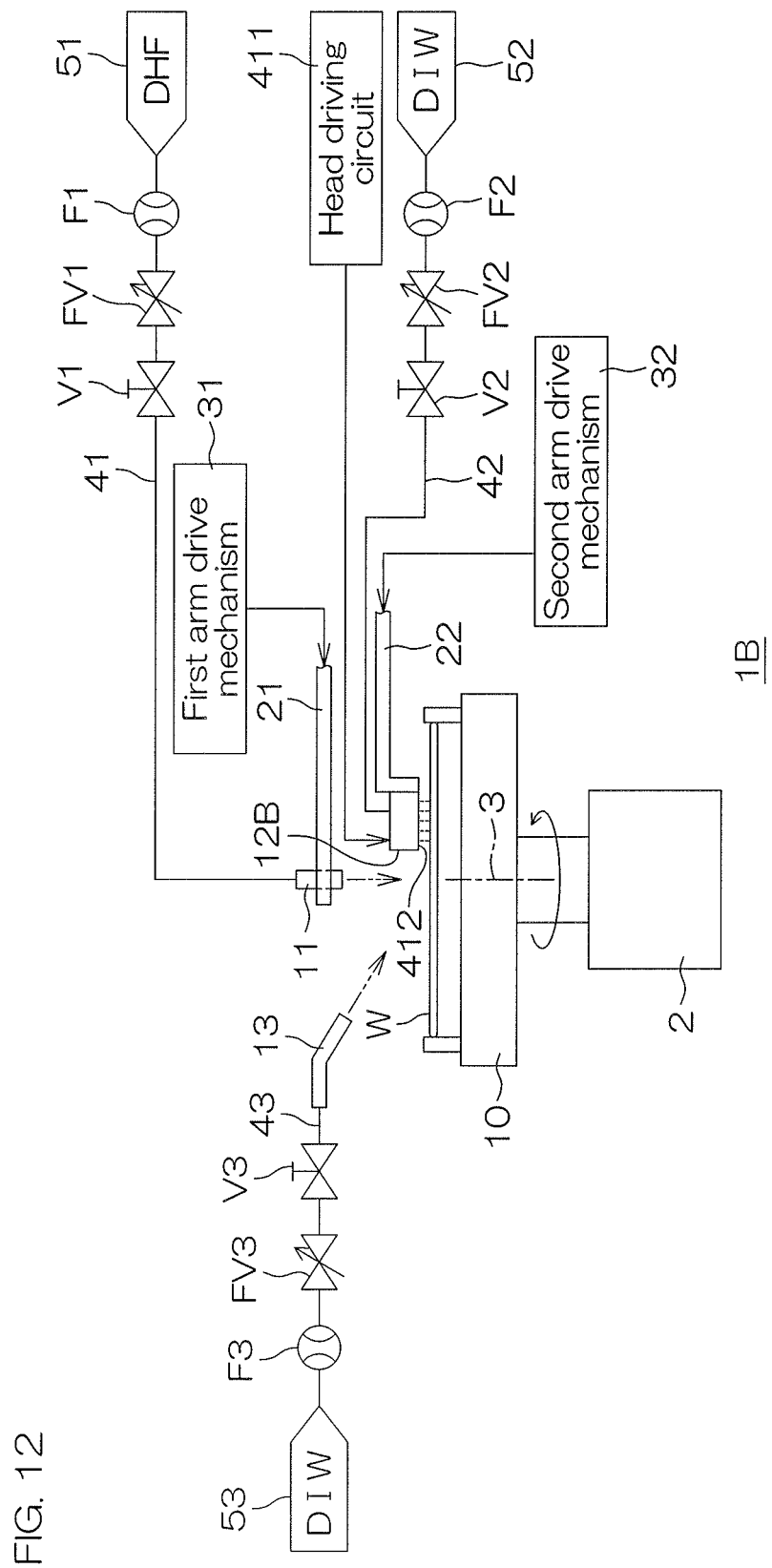
FIG. 12 is an explanatory conceptual diagram illustrating the configuration of a substrate processing apparatus according to still another preferred embodiment of the present invention.

FIG. 12 is an explanatory conceptual diagram illustrating the configuration of the substrate processing apparatus 1B according to still another preferred embodiment of the present invention. In FIG. 12, the same portions as those illustrated in FIG. 5 are given the same reference signs. In this preferred embodiment, as the physical cleaning means, in place of the two-fluid nozzle, the second movable nozzle 12B composed of a discharge head having the form of an ink jet head is provided. The second movable nozzle 12B is coupled to the second processing liquid supply path 42, and is arranged to receive DIW supplied from the DIW supply source 52. The second movable nozzle 12B is connected with a head driving circuit 411.

The second movable nozzle 12A has a substrate opposing surface 412 that opposes the substrate W. On the substrate opposing surface 412, a plurality of discharge ports are disposed by being aligned. The second movable nozzle 12A discharges DIW droplets from a plurality of discharge ports to the substrate W by the ink jet method. The kinetic energy of the droplets causes the particles on the surface of the substrate W to be separated from the surface of the substrate W. In this manner, the second movable nozzle 12B with a discharge head having the form of an ink jet head supplies droplets onto the surface of the substrate W, thereby executing the ink jet type droplets cleaning step as the physical cleaning step. The physical cleaning energy in this case is controlled by adjusting the discharge speed of the droplets, that is, the output of the head driving circuit 411. Note that the discharge head having the form of the ink jet head is disclosed in detail, for example, in Japanese Patent Application Publication No. 2014-179449.

Figure 13:
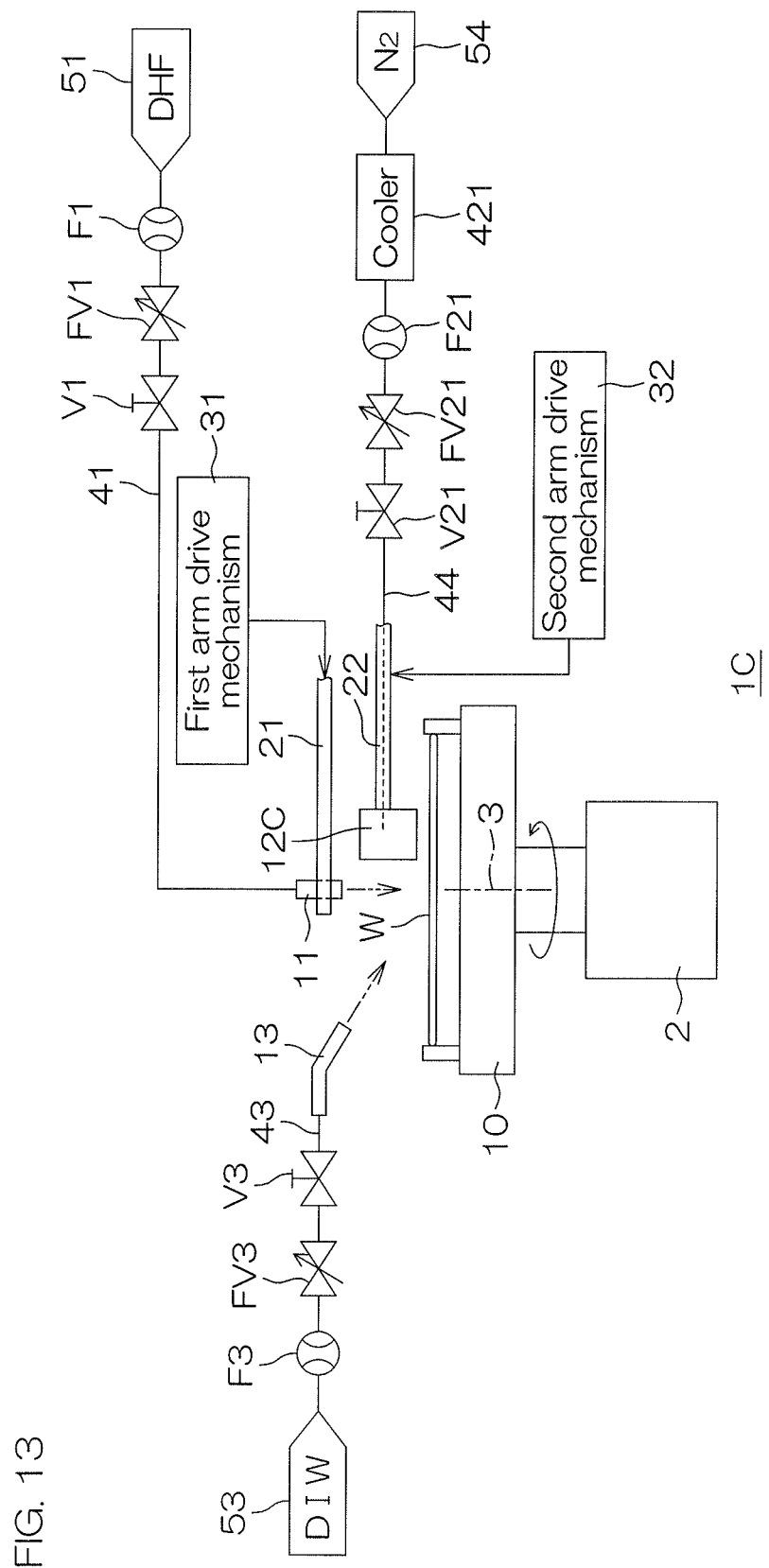
FIG. 13 is an explanatory conceptual diagram illustrating the configuration of a substrate processing apparatus according to still another preferred embodiment of the present invention.

FIG. 13 is an explanatory conceptual diagram illustrating the configuration of the substrate processing apparatus 1C according to still another preferred embodiment of the present invention. In FIG. 13, the same portions as those illustrated in FIG. 5 are given the same reference signs. In this preferred embodiment, as the physical cleaning means, in place of the two-fluid nozzle, the second movable nozzle 12C composed of a gas coolant nozzle (a cooling head: an example of liquid film solidification means) is provided. The second movable nozzle 12C is coupled to the gas supply path 44, and arranged to receive an inert gas (e.g., a nitrogen gas) supplied from the inert the gas supply source 54. At some midpoint of the gas supply path 44, a cooler 421 is disposed that cools the inert gas. Thus, the second movable nozzle 12C is supplied with a cooled inert gas (gas coolant).

In this preferred embodiment, the physical cleaning step includes a step of forming liquid film on the surface of the substrate W, a step of forming a solidified film by supplying the gas coolant from the second movable nozzle 12C to solidify (freeze) the liquid film, and a step of melting the solidified film and then removing the film to outside the substrate W. The particles on the substrate W are taken into the solidified film to be thereby separated from the surface of the substrate W and after that, removed to outside the substrate W as the solidified film is melted.

For example, the liquid film is formed by a rinse liquid (e.g., DIW) supplied from the fixed nozzle 13. The gas coolant discharged from the second movable nozzle 12C is a gas that is cooled to a temperature lower than the freezing point of the liquid that constitutes the liquid film.

The solidified film may be melted by supplying the rinse liquid (e.g., DIW) from the fixed nozzle 13.

In this manner, the substrate cleaning is performed by following, as the physical cleaning step, the solidification cleaning step (in this preferred embodiment, the freeze cleaning step) in which the liquid film is formed on the surface of the substrate W, more precisely speaking, on the surface of the natural oxide film and after that, solidified to form a solidified film, and then that solidified film is melted and removed. The energy of the physical cleaning in this case can be controlled by the film thickness of the solidified film, more specifically, by the cooling time, etc. Note that the solidification cleaning (freeze cleaning) is described in detail, for example, in Japanese Patent Application Publication No. 2013-30612.

The liquid to be used to form the liquid film in the solidification cleaning may be a polymeric material. That is, it is possible to form the liquid film of a polymeric material on the substrate and then solidify the polymeric material into a solidified film, and after that, dissolve the solidified film, thereby removing the particles on the substrate W in conjunction with the melted polymeric material. The liquid film solidification means of solidifying the liquid film and the melting means of melting the solidified film may be selected depending on the polymeric material to be employed.

In the foregoing, the preferred embodiments of the present invention have been described; however, the present invention may be achieved in still another form. For example, in the aforementioned preferred embodiment, such an example has been illustrated in which particles are partially taken into the natural oxide film 70 on the surface of the substrate W; however, the substrate cleaning method of the present invention can also be applied even to the case where particles are taken into an oxide film other than the natural oxide film.

Furthermore, in the aforementioned preferred embodiment, the diluted hydrofluoric acid has been illustrated byway of example as the etching liquid in the partial etching step; however, any other etching liquid may be employed in the partial etching.

Furthermore, in the aforementioned preferred embodiment, illustrated as the physical cleaning have been the ultrasonic cleaning, the two-fluid cleaning, the ink jet cleaning, and the solidification cleaning; however, any other physical cleaning may be employed. Furthermore, two or more types of physical cleaning may be employed. For example, the two-fluid cleaning and the solidification cleaning may be combined.

Furthermore, in the aforementioned preferred embodiment, recipe data is checked against the criteria data after step data is created, but may be checked against the criteria data at the stage of creating step data. For example, in the case where the partial etching step data is created and after that, the physical cleaning step data is created, the recipe creating program 102 may present (e.g., display on the display 95), at the time of creating the physical cleaning step data, the physical cleaning condition that matches the etching condition specified by the partial etching step data. More specifically, at the time of creating the physical cleaning step data, the recipe creating program 102 may be arranged to pre-set the physical cleaning condition that matches the criteria data. On the contrary, in the case where the physical cleaning step data is created and after that, the partial etching step data is created, the recipe creating program 102 may present (e.g., display on the display 95), at the time of creating the partial etching step data, the etching condition that matches the physical cleaning condition specified by the physical cleaning step data. More specifically, at the time of creating the partial etching step data, the recipe creating program 102 may be arranged to pre-set the etching condition that matches of criteria data.

The present application corresponds to Japanese Patent Application No. 2016-187098 filed with Japan Patent Office on Sep. 26, 2016, and all disclosures of the present application are incorporated herein by reference.

Although the preferred embodiments of the present invention are described in detail above, they are simply specific examples which are used to clarify the technical contents of the present invention, the present invention should not be interpreted as being limited to these specific examples and the scope of the present invention is limited only by the attached claims.

REFERENCE SIGNS LIST 1, 1A, 1B, 1C: Substrate processing apparatus
2: Electric motor
3: Rotational axial line
10: Spin chuck
11: First movable nozzle (etching liquid nozzle)
12: Second movable nozzle (two-fluid nozzle)
12a: Second movable nozzle (ultrasonic nozzle)
12b: Second movable nozzle (discharge head)
12c: Second movable nozzle (cooling head)
13: Fixed nozzle
21: First scan arm
22: Second scan arm
31: First arm drive mechanism
32: Second arm drive mechanism
41: First processing liquid supply path
42: Second processing liquid supply path
43: Third processing liquid supply path
44: Gas supply path
51: Hydrofluoric acid supply source
52: DIW supply source
53: Rinse liquid supply source
54: Inert gas supply source
70: Natural oxide film
71: Surface portion
72: Portion left after etching
80: Diluted hydrofluoric acid
81: Mixed fluid
90: Controller
91: Processor
92: Storage unit
95: Display
96: Input unit
100: Program
101: Substrate processing program
102: Recipe creating program
110: Data
111: Recipe data
112: Criteria data
120: Data input interface
121: Inner nozzle member
122: Outer nozzle member
123: Liquid jet outlet
124: Gas jet outlet
125: Gap
126: Mixture point
200: Computer system
201: Computer main body
202: Display
203: Input unit
204: Data input/output interface
211: Processor
212: Storage unit
300: Program
310: Data
401: Vibration plate
402: High-frequency oscillator circuit
411: Head driving circuit
412: Substrate opposing surface
421: Cooler
V1: First processing liquid valve
V2: Second processing liquid valve
V3: Third processing liquid valve
V21: Inert gas valve
F1 to F3, F21: Flowmeter
FV1 to FV3, FV21: Flow rate adjustment valve
LD: Curve denoting pattern damage frequency distribution
LE: Curve denoting physical cleaning energy distribution
LP: Curve denoting residual particle frequency distribution
P: Particles
PW: Process window
n1 to n4: Inert gas flow rate
r1 to r4: Appropriate etching time range
r11, r12, r21, r22, r31, r32, r41, r42: Etching time range
W: Substrate

What is claimed is:

1. A substrate cleaning recipe creating method for creating recipe data to be registered with a substrate processing apparatus in order to execute, in the substrate processing apparatus, substrate cleaning processing to clean a substrate having an oxide film on a surface, thereof wherein the substrate cleaning processing includes a partial etching step of etching the oxide film to a predetermined film thickness, and a physical cleaning step of executing the physical cleaning on the surface of the substrate after the partial etching step, and the method for creating a substrate cleaning recipe comprises: a partial etching step creating step of creating step data for executing the partial etching step; a physical cleaning step creating step of creating step data for executing the physical cleaning step; and a condition matching step of matching an etching condition in the partial etching step and a physical cleaning condition in the physical cleaning step with each other on the basis of criteria data prepared and stored in a storage in advance, wherein the partial etching step creating step includes a step of creating the step data including the etching condition in the partial etching step; and the condition matching step includes a step in which a processor presents or sets, on the basis of the criteria data stored in the storage, the physical cleaning condition that matches the etching condition included in the step data created in the partial etching step creating step.

2. A substrate cleaning recipe creating method for creating recipe data to be registered with a substrate processing apparatus in order to execute, in the substrate processing apparatus, substrate cleaning processing to clean a substrate having an oxide film on a surface, thereof wherein the substrate cleaning processing includes a partial etching step of etching the oxide film to a predetermined film thickness, and a physical cleaning step of executing the physical cleaning on the surface of the substrate after the partial etching step, and the method for creating a substrate cleaning recipe comprises: a partial etching step creating step of creating step data for executing the partial etching step; a physical cleaning step creating step of creating step data for executing the physical cleaning step; and a condition matching step of matching an etching condition in the partial etching step and a physical cleaning condition in the physical cleaning step with each other on the basis of criteria data prepared and stored in a storage in advance, wherein the physical cleaning step creating step includes a step of creating the step data including the physical cleaning condition in the physical cleaning step; and the condition matching step includes a step in which a processor presents or sets, on the basis of the criteria data stored in the storage, the etching condition that matches the physical cleaning condition included in the step data created in the physical cleaning step creating step.

* * * * *